(12) United States Patent
Tabata et al.

(10) Patent No.: US 12,282,117 B2
(45) Date of Patent: Apr. 22, 2025

(54) LIGHT SOURCE APPARATUS AND SENSING MODULE

(71) Applicant: SONY SEMICONDUCTOR SOLUTIONS CORPORATION, Kanagawa (JP)

(72) Inventors: Mitsushi Tabata, Kanagawa (JP); Takashi Masuda, Kanagawa (JP); Takeshi Yuwaki, Kanagawa (JP); Yasuo Oba, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 1078 days.

(21) Appl. No.: 17/250,773

(22) PCT Filed: Aug. 5, 2019

(86) PCT No.: PCT/JP2019/030754
§ 371 (c)(1),
(2) Date: Mar. 2, 2021

(87) PCT Pub. No.: WO2020/054257
PCT Pub. Date: Mar. 19, 2020

(65) Prior Publication Data
US 2021/0349188 A1    Nov. 11, 2021

(30) Foreign Application Priority Data

Sep. 11, 2018   (JP) .................................. 2018-169621

(51) Int. Cl.
*G01S 7/481*    (2006.01)
*G01S 17/894*    (2020.01)
(Continued)

(52) U.S. Cl.
CPC .......... *G01S 7/4815* (2013.01); *G01S 17/894* (2020.01); *H01S 5/0261* (2013.01); *H01S 5/423* (2013.01)

(58) Field of Classification Search
CPC .... G01S 7/4815; G01S 17/894; H01S 5/0261; H01S 5/423; H01S 5/0428; H01S 5/026; H01S 5/18305; H01S 5/02345
See application file for complete search history.

(56) References Cited

U.S. PATENT DOCUMENTS 6,005,262 A    12/1999  Cunningham et al.
6,246,708 B1    6/2001  Thornton et al.
(Continued)

FOREIGN PATENT DOCUMENTS

CN    102650718 A    8/2012
CN    106505410 A    3/2017
(Continued)

OTHER PUBLICATIONS

International Search Report and Written Opinion of PCT Application No. PCT/JP2019/030754, issued on Nov. 5, 2019, 09 pages of ISRWO.

*Primary Examiner* — Isam A Alsomiri
*Assistant Examiner* — Joseph C Fritchman
(74) *Attorney, Agent, or Firm* — CHIP LAW GROUP

(57) ABSTRACT

A suppression of a rise in temperature is to be attained for a light source apparatus provided with an emission section in which a plurality of vertical-cavity surface-emitting laser light-emitting elements is arrayed. A light source apparatus according to the present technology includes an emission section in which a plurality of vertical-cavity surface-emitting laser light-emitting elements is arrayed, and a driving section configured to cause the plurality of light-emitting elements of the emission section to emit light, in which at least a portion of a region including driving elements in the (Continued)

driving section is disposed so as not to overlap with the emission section.

10 Claims, 18 Drawing Sheets

(51) Int. Cl.
   *H01S 5/026* (2006.01)
   *H01S 5/42* (2006.01)

(56) References Cited

U.S. PATENT DOCUMENTS

2015/0277066 A1* 10/2015 Nakagawa ............. G02B 6/125
                                                              385/33
2018/0124942 A1* 5/2018 Kaikkonen ............. H05K 7/026
2018/0176496 A1 6/2018 Nakamura et al.
2018/0197842 A1* 7/2018 Tokunari ............... H01L 25/167

FOREIGN PATENT DOCUMENTS

| | | | |
|---|---|---|---|
| CN | 108209867 A | | 6/2018 |
| DE | 112014003371 T5 | | 4/2016 |
| EP | 899835 A1 | | 3/1999 |
| JP | 5-145195 A | | 6/1993 |
| JP | H09232687 A | | 9/1997 |
| JP | 11-121735 A | | 4/1999 |
| JP | 2002232062 A | * | 8/2002 |
| JP | 2012-195436 A | | 10/2012 |
| JP | 2015-103727 A | | 6/2015 |
| JP | 2016-146417 A | | 8/2016 |
| JP | 2018-96988 A | | 6/2018 |

* cited by examiner

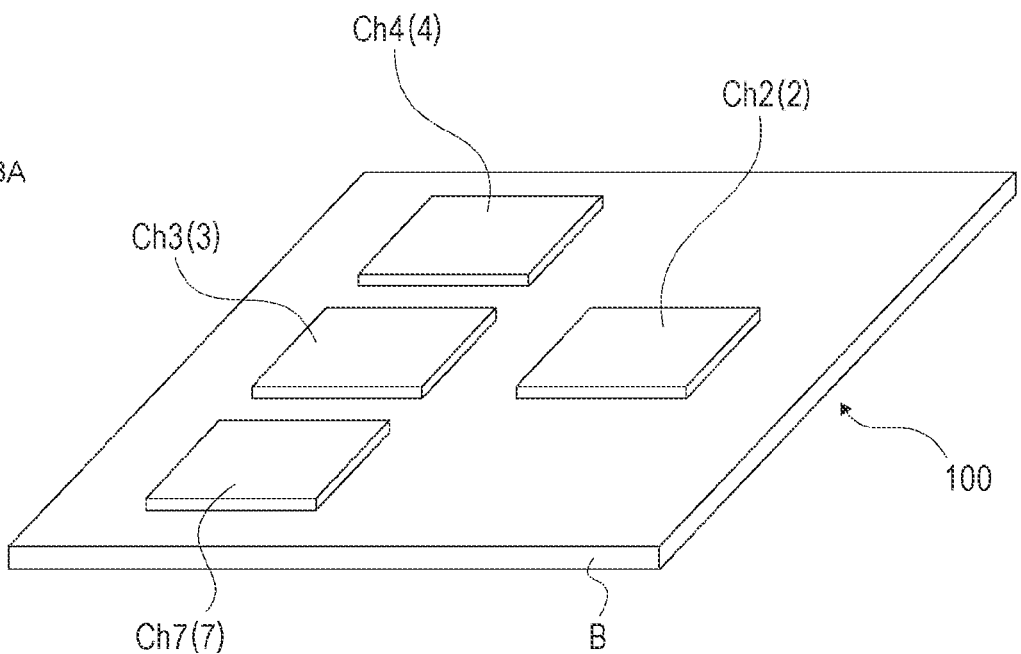
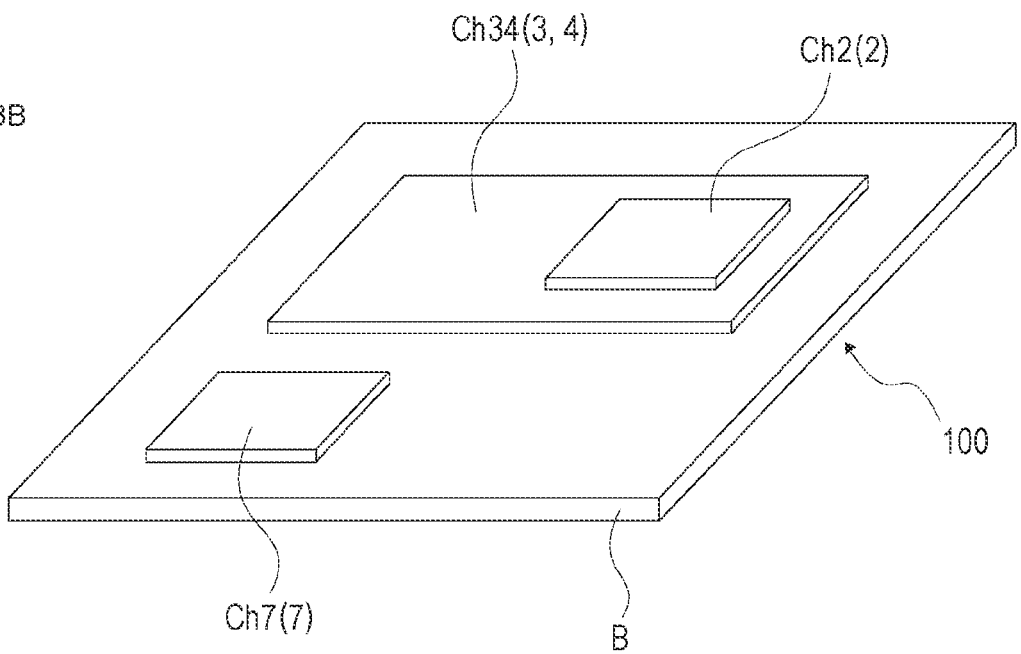

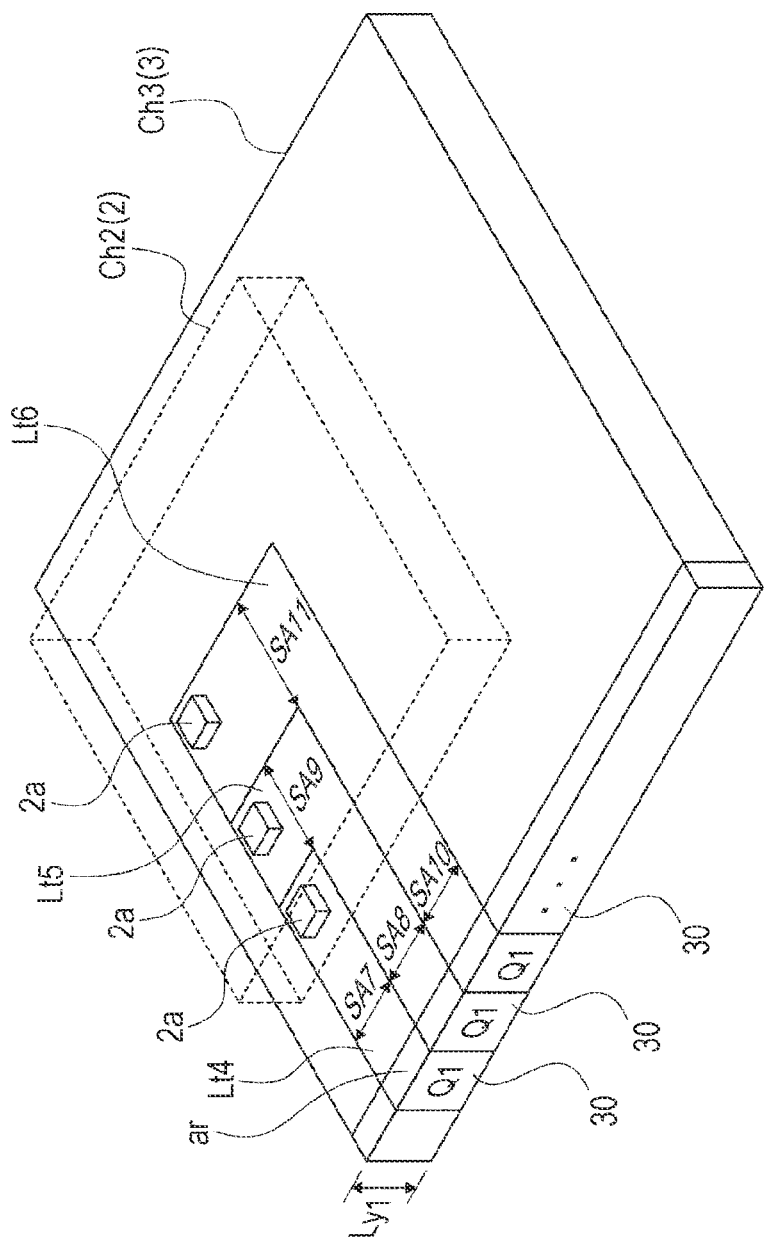

LIGHT SOURCE APPARATUS AND SENSING MODULE

CROSS REFERENCE TO RELATED APPLICATIONS

This application is a U.S. National Phase of International Patent Application No. PCT/JP2019/030754 filed on Aug. 5, 2019, which claims priority benefit of Japanese Patent Application No. JP 2018-169621 filed in the Japan Patent Office on Sep. 11, 2018. Each of the above-referenced applications is hereby incorporated herein by reference in its entirety.

TECHNICAL FIELD

The present technology relates to a light source apparatus provided with an emission section in which a plurality of vertical-cavity surface-emitting laser light-emitting elements is arrayed, and a sensing module provided with an image sensor that captures an image by receiving light that is emitted by the emission section and then reflected by a subject.

BACKGROUND ART

The vertical-cavity surface-emitting laser (VCSEL) is known as a light-emitting element that emits laser light, as described by Patent Literatures 1 and 2 below, for example.

A VCSEL light-emitting element is configured such that an oscillator is formed perpendicular to the semiconductor substrate surface and laser light is emitted in the perpendicular direction, and in recent years, VCSELs have been used widely as light sources when measuring the distance to a subject according to a structured light (STL) method and a time of flight (ToF) method, for example.

CITATION LIST

Patent Document

Patent Document 1: Japanese Patent Application Laid-Open No. 2012-195436
Patent Document 2: Japanese Patent Application Laid-Open No. 2015-103727

SUMMARY OF THE INVENTION

Problems to be Solved by the Invention

Here, in the case of measuring the distance to a subject according to an STL method or a ToF method, a light source in which a plurality of VCSEL light-emitting elements is disposed in a two-dimensional array is used. Specifically, the subject is illuminated with light emitted from the plurality of light-emitting elements, and the distance to the subject is measured on the basis of an image obtained by receiving reflected light from the subject.

When measuring distance in this way, the plurality of light-emitting elements is made to emit light, but heat generated by components such as the driving circuit for causing the light-emitting elements to emit light causes the temperature of the chip in which the light-emitting elements are formed to rise easily, which may lead to a heat-induced malfunction such as a drop in the emission efficiency of the light-emitting elements. Also, the temperature of the light-emitting elements rises due to emission, and such generated heat may lead to degraded circuit characteristics in the driving circuit that drives the light-emitting elements.

The present technology has been devised in light of the above circumstances, and an object is to attain a suppression of a rise in the temperature for a light source apparatus provided with an emission section in which a plurality of vertical-cavity surface-emitting laser light-emitting elements is arrayed.

Solutions to Problems

A light source apparatus according to the present technology includes an emission section in which a plurality of vertical-cavity surface-emitting laser light-emitting elements is arrayed, and a driving section configured to cause the plurality of light-emitting elements of the emission section to emit light, in which at least a portion of a region including driving elements in the driving section is disposed so as not to overlap with the emission section.

With this arrangement, the heat generated from the driving elements and transmitted to the light-emitting elements is reduced. Also, the heat generated by the light-emitting elements and transmitted to the driving circuit of the driving section is also reduced.

In the light source apparatus according to the present technology described above, it is desirable that a chip in which the emission section is formed be mounted onto a chip in which the driving section is formed, and at least a portion of the region including the driving elements of the driving section be disposed so as not to overlap with the light-emitting elements of the emission section.

With this arrangement, the leads that connect the emission section and the driving section can be shortened, and an increase in wiring resistance can be moderated. Also, the region including the driving elements can be provided at a distance from the light-emitting elements that generate heat.

In the light source apparatus according to the present technology described above, it is desirable that the driving section include a plurality of wiring layers in which leads for electrically connecting the driving elements and the light-emitting elements are formed.

With this arrangement, the leads can be arranged while maintaining the cross-sectional area of the leads, and an increase in wiring resistance is moderated.

In the light source apparatus according to the present technology described above, it is desirable that the leads be formed such that a distance between the driving elements and the light-emitting elements connected to each other is longer in lower wiring layers.

With this arrangement, when drawing out a lead from a lower layer toward a higher layer, it is possible to avoid a situation in which a higher-layer lead obstructs the drawing-out of the lower-layer lead.

In the light source apparatus according to the present technology described above, it is desirable that a plurality of regions including the driving elements be provided in the driving section.

By dividing the region including the driving elements into a plurality of regions, the lengths of the leads that connect the driving elements and the light-emitting elements can be shortened.

In the light source apparatus according to the present technology described above, it is desirable that as a length of the leads increases, a portion of increased cross-sectional area when taking a cross section in a plane perpendicular to an extension direction of the leads be formed in the leads.

Because the leads are lengthened due to the increased distance from the driving elements to the light-emitting elements, the wiring resistance increases. For this reason, the cross-sectional area of the leads is increased to moderate the increase in wiring resistance.

In the light source apparatus according to the present technology described above, it is desirable to increase the width in the thickness direction of the wiring layers in the portion of the leads.

By increasing the width in the thickness direction of the wiring layers, the cross-sectional area of the leads increases, and an increase in wiring resistance is moderated.

In the light source apparatus according to the present technology described above, it is desirable to increase the width of the portion of the leads in the planar direction of the wiring layers.

By increasing the width in the planar direction of the wiring layers, the cross-sectional area of the leads increases, and an increase in wiring resistance is moderated.

In the light source apparatus according to the present technology described above, it is desirable that the cross-sectional area of the leads provided in the wiring layers be larger in lower wiring layers.

The lower the wiring layer, the greater the distance from the driving elements to the light-emitting elements, and the leads become longer as a result. With this arrangement, the wiring resistance increases for leads provided in lower layers. For this reason, the cross-sectional area of the leads in lower layers is increased to moderate the increase in wiring resistance.

In the light source apparatus according to the present technology described above, it is desirable that the driving section be configured to be capable of individually driving emission operation for each predetermined unit of a plurality of the light-emitting elements.

The predetermined unit may be a unit containing a single light-emitting element, a unit containing a block of multiple light-emitting elements, or the like.

With this configuration, the emission driving current can be set to turn emission ON/OFF individually for each light-emitting element or in units of blocks acting as multiple light-emitting element groups, for example.

In the light source apparatus according to the present technology described above, it is desirable that the emission section be configured to emit light in synchronization with a frame period of an image sensor configured to receive light emitted by the emission section and reflected by a subject.

With this arrangement, to handle the case of measuring distance by illuminating a subject with light emitted by the emission section and receiving the light with an image sensor, it is possible to cause the light-emitting elements to emit light at appropriate timings according to the frame cycle of the image sensor.

Furthermore, a sensing module according to the present technology described above includes a light source apparatus provided with an emission section in which a plurality of vertical-cavity surface-emitting laser light-emitting elements is arrayed, and a driving section configured to cause the plurality of light-emitting elements of the emission section to emit light, in which at least a portion of a region including driving elements in the driving section is disposed so as not to overlap with the emission section, and an image sensor configured to capture an image by receiving light emitted by the emission section and reflected by a subject.

Action similar to the light source apparatus according to the present technology described above are also obtained by such a driving method and sensing module.

Effects of the Invention

According to the present technology, a suppression of a rise in temperature can be attained for a light source apparatus provided with an emission section in which a plurality of vertical-cavity surface-emitting laser light-emitting elements is arrayed.

Note that, the effect described here is not necessarily limited, and can be any effect described in the present disclosure.

BRIEF DESCRIPTION OF DRAWINGS

FIGS. 8A and 8B are diagrams illustrating yet another exemplary substrate configuration of the light source apparatus as an embodiment.

FIG. 17 is another diagram for explaining leads that connect the emission section and the driving section as an embodiment.

MODE FOR CARRYING OUT THE INVENTION

Hereinafter, the attached drawings will be referenced to describe embodiments according to the present technology in the following order.
<1. Configuration of distance measuring apparatus>
<2. Distance measuring techniques>
<3. Circuit configuration related to emission driving>
<4. Variations in substrate configuration>
<5. Exemplary VCSEL structure>
<6. Arrangement relationship between light-emitting elements and driving transistors>
<7. Leads that connect light-emitting elements and driving transistors>
<8. Summary of embodiment and modifications>
<9. Present technology>

1. CONFIGURATION OF DISTANCE MEASURING APPARATUS

Figure 1:
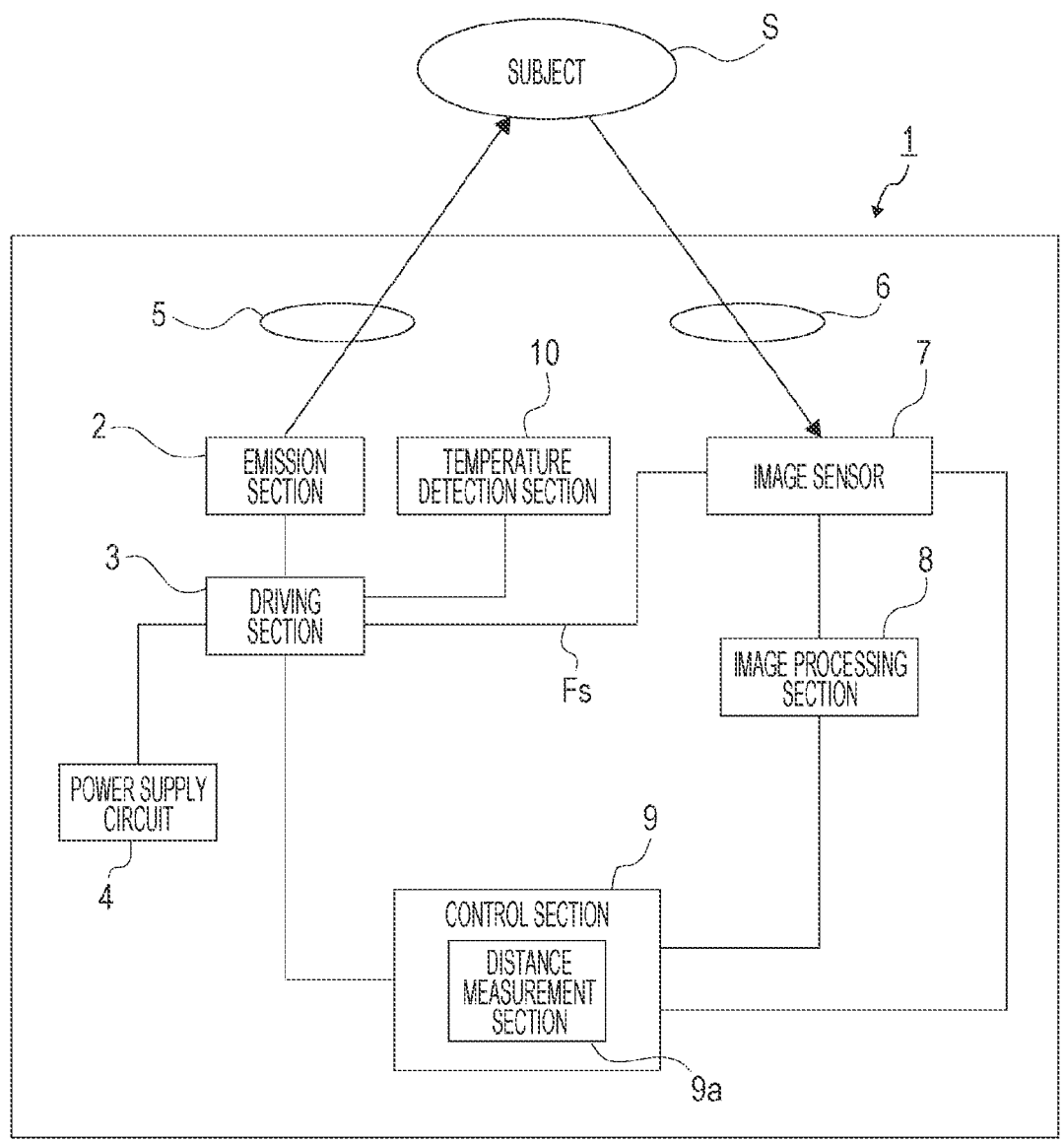
FIG. 1 is a diagram illustrating an exemplary configuration of a distance measuring apparatus as an embodiment of a light source apparatus according to the present technology.

FIG. 1 illustrates an exemplary configuration of a distance measuring apparatus 1 as an embodiment of a light source apparatus according to the present technology.

As illustrated in the diagram, the distance measuring apparatus 1 is provided with an emission section 2, a driving section 3, a power supply circuit 4, an emission-side optical system 5, an imaging-side optical system 6, an image sensor 7, an image processing section 8, a control section 9, and a temperature detection section 10.

The emission section 2 emits light from a plurality of light sources. As described later, the emission section 2 in this example includes vertical-cavity surface-emitting laser (VCSEL) light-emitting elements 2a as the light sources, and these light-emitting elements 2a are arrayed in a predetermined pattern, such as a matrix for example.

The driving section 3 includes an electrical circuit for driving the emission section 2.

The power supply circuit 4 generates a power supply voltage for the driving section 3 (a driving voltage Vd described later) on the basis of an input voltage (an input voltage Vin described later) from a source such as a battery not illustrated that is provided in the distance measuring apparatus 1, for example. The driving section 3 drives the emission section 2 on the basis of the power supply voltage.

Light emitted by the emission section 2 illuminates, through the emission-side optical system 5, a subject S treated as the target of distance measurement. Thereafter, reflected light from the subject S out of the light emitted in this way is incident on the imaging surface of the image sensor 7 through the imaging-side optical system 6.

The image sensor 7 is an image sensor such as a charge-coupled device (CCD) sensor or a complementary metal-oxide semiconductor (CMOS) sensor for example that receives reflected light from the subject S incident through the imaging-side optical system 6 as above, and converts the received light to output an electrical signal.

The image sensor 7 executes processes such as a correlated double sampling (CDS) process and an automatic gain control (AGC) process on the electrical signal obtained by photoelectric conversion of the received light, and furthermore performs an analog/digital (A/D) conversion process. An image signal is then output as digital data to the image processing section 8 downstream.

Additionally, the image sensor 7 in this example outputs a frame synchronization signal Fs to the driving section 3. With this arrangement, the driving section 3 is capable of causing the light-emitting elements 2a in the emission section 2 to emit light at timings according to the frame cycle of the image sensor 7.

The image processing section 8 is configured as an image processor such as a digital signal processor (DSP), for example. The image processing section 8 performs various types of image signal processing on the digital signal (image signal) input from the image sensor 7.

The control section 9 is provided with an information processing device such as a microcomputer including components such as a central processing unit (CPU), read-only memory (ROM), and random access memory (RAM), or a DSP. The control section 9 controls the driving section 3 for controlling the emission operations by the emission section 2 and controls imaging operations by the image sensor 7.

The control section 9 includes functions that act as a distance measurement section 9a. The distance measurement section 9a measures the distance to the subject S on the basis of the image signal input through the image processing section 8 (that is, the image signal obtained by receiving reflected light from the subject S). The distance measurement section 9a in this example measures the distance to different portions of the subject S, thereby making it possible to identify the three-dimensional shape of the subject S.

Herein, specific techniques of measuring distance in the distance measuring apparatus 1 will be described in further detail later.

The temperature detection section 10 detects the temperature of the emission section 2. A configuration that detects temperature using a diode for example can be adopted as the temperature detection section 10.

In this example, information about the temperature detected by the temperature detection section 10 is supplied to the driving section 3, thereby enabling the driving section 3 to drive the emission section 2 on the basis of the information about the temperature.

2. DISTANCE MEASURING TECHNIQUES

As the technique of measuring distance in the distance measuring apparatus 1, a technique of measuring distance according to a structured light (STL) method or a time of flight (ToF) method can be adopted, for example.

The STL method measures distance on the basis of an image obtained by imaging the subject S illuminated with light having a predetermined light/dark pattern, such as a dot pattern or a grid pattern, for example.

Figure 2A:
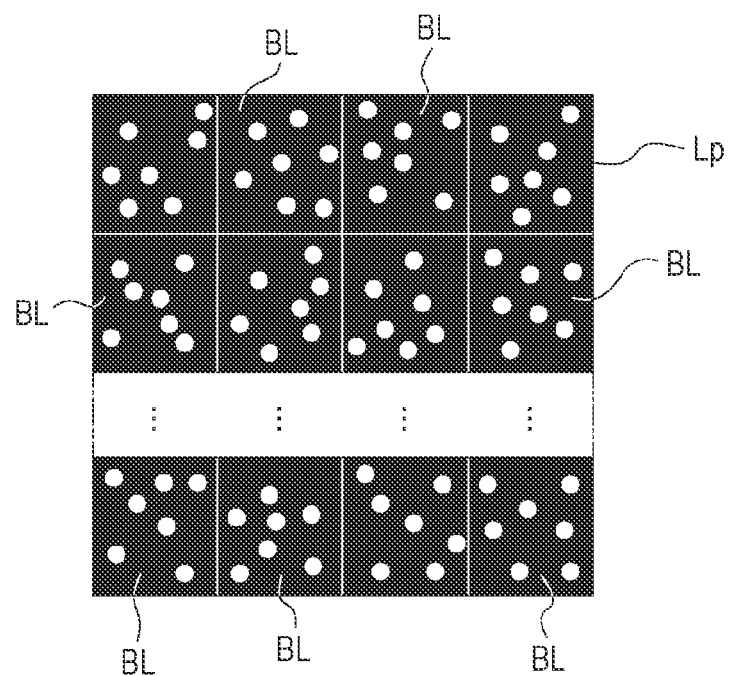
FIGS. 2A and 2B are diagrams explaining a technique of measuring distance according to a structured light (STL) method.
Figure 2B:
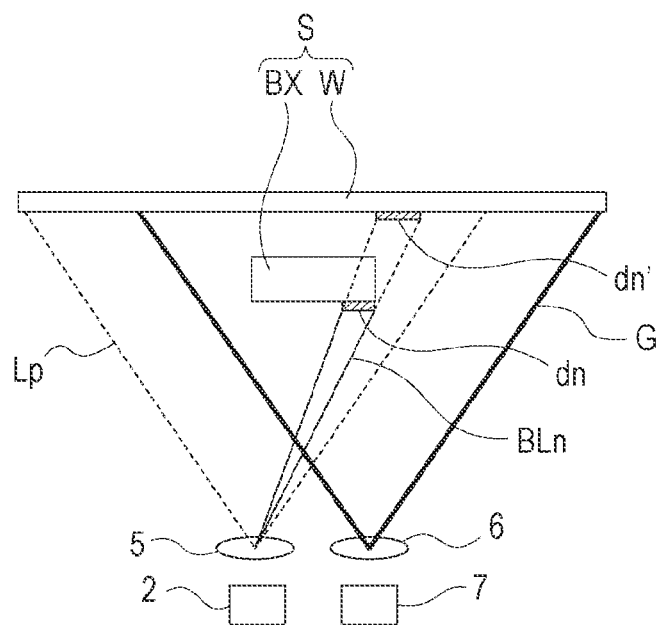

FIGS. 2A and 2B are diagrams explaining the STL method.

In the STL method, the subject S is illuminated with pattern light Lp having a dot pattern like the one illustrated in FIG. 2A, for example. The pattern light Lp is divided into a plurality of blocks BL, and a different dot pattern is assigned to each block BL (the dot patterns are not duplicated among the blocks BL).

FIG. 2B is a diagram explaining the principle of distance measurement according to the STL method.

In the example herein, a wall W and a box BX placed in front are treated as the subject S, and the subject S is illuminated with pattern light Lp. In the diagram, "G" schematically represents the angle of view of the image sensor 7.

Also, "BLn" in the diagram means the light from a certain block BL among the pattern light Lp, and "dn" means the dot pattern of the block BLn appearing in the captured image obtained by the image sensor 7.

Here, in the case where the box BX in front of the wall W does not exist, the dot pattern of the block BLn appears in the captured image at a position "dn" in the diagram. In other words, the position where the pattern of the block BLn appears in the captured image is different between the case where the box BX exists and the case where the box BX does not exist, and more specifically, a distortion in the pattern occurs.

The STL method is a method of obtaining the shape and the depth of the subject S by utilizing how the illuminating pattern is distorted by the physical shape of the subject S in this way. Specifically, the STL method is a method of obtaining the shape and the depth of the subject S from the way in which the pattern is distorted.

In the case of adopting the STL method, an infrared (IR) image sensor with a global shutter is used as the image sensor 7, for example. Additionally, in the case of the STL method, the distance measurement section 9a controls the driving section 3 such that the emission section 2 emits pattern light, and in addition, detects pattern distortion in the image signal obtained through the image processing section 8, and calculates the distance on the basis of the way in which the pattern is distorted.

Next, the ToF method measures the distance to a target by detecting the time of flight (time difference) of light that is emitted by the emission section 2, reflected by the target, and arrives at the image sensor 7.

In the case of adopting what is called the direct ToF method as the ToF method, a single-photon avalanche diode (SPAD) is used as the image sensor 7, and the emission section 2 is pulse-driven. In this case, the distance measurement section 9a calculates the time difference from emission to reception for light that is emitted by the emission section 2 and received by the image sensor 7 on the basis of the image signal input through the image processing section 8, and calculates the distance to different portions of the subject S on the basis of the time difference and the speed of light.

Note that in the case of adopting what is called the indirect ToF method (phase difference method) as the ToF method, an IR image sensor is used as the image sensor 7, for example.

3. CIRCUIT CONFIGURATION RELATED TO EMISSION DRIVING

Figure 3:
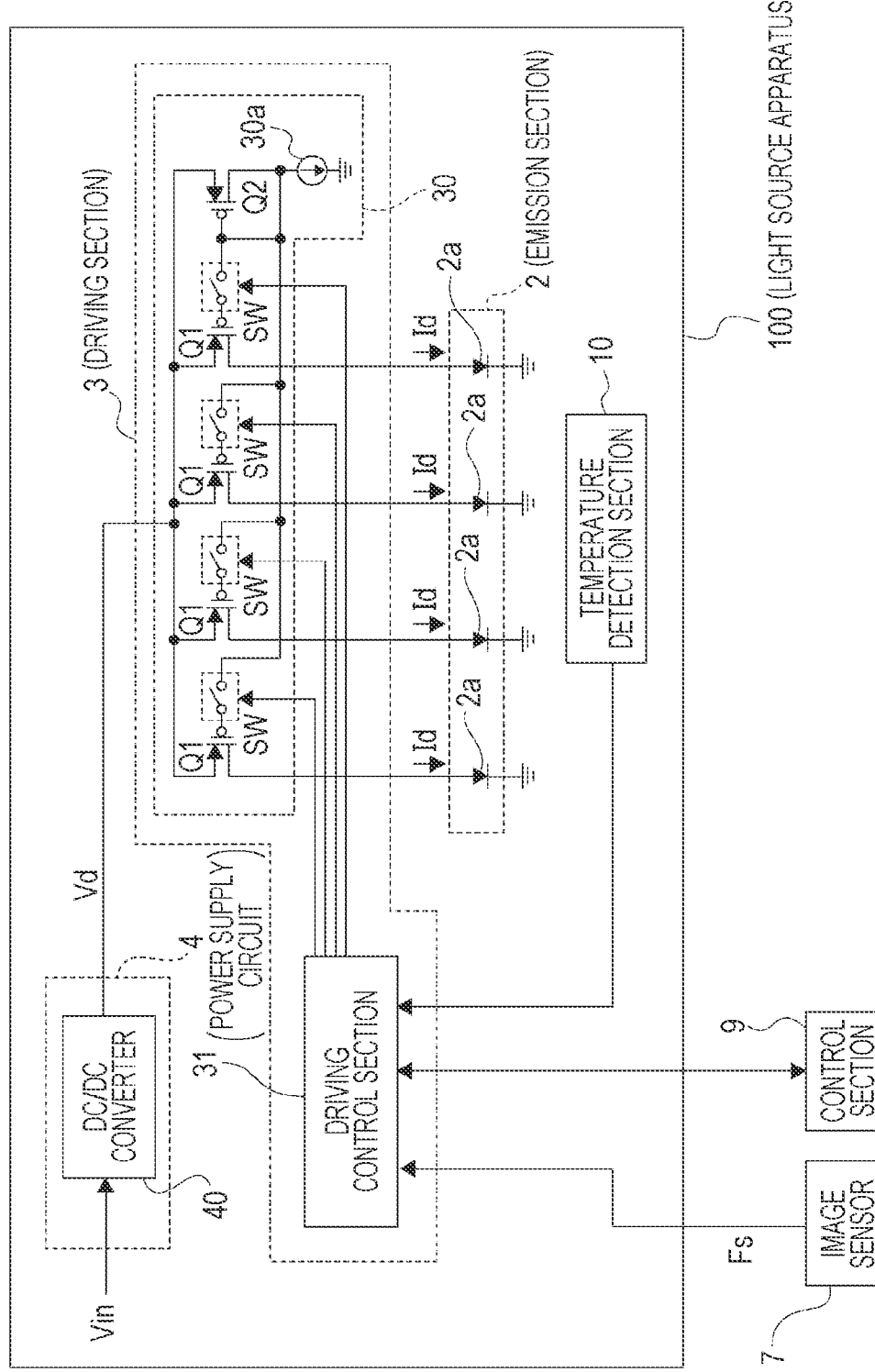
FIG. 3 is a diagram illustrating an exemplary circuit configuration of the light source apparatus as an embodiment.

FIG. 3 illustrates an exemplary circuit configuration of a light source apparatus 100 that includes the emission section 2, the driving section 3, and the power supply circuit 4 illustrated in FIG. 1. Note that in addition to the exemplary circuit configuration of the light source apparatus 100, FIG. 3 also illustrates the image sensor 7 and the control section 9 illustrated in FIG. 1.

In this example, the emission section 2, the driving section 3, and the power supply circuit 4 are formed on a common substrate (a substrate B described later). Here, the configuration unit that includes at least the emission section 2 and is formed on a common substrate with the emission section 2 is referred to as the light source apparatus 100.

As illustrated in the diagram, the light source apparatus 100 is provided with the temperature detection section 10 in addition to the emission section 2, the driving section 3, and the power supply circuit 4.

The emission section 2 is provided with a plurality of VCSEL light-emitting elements 2a as described earlier. In FIG. 3, the number of light-emitting elements 2a is treated as "4" for convenience, but the number of light-emitting elements 2a in the emission section 2 is not limited thereto, and is sufficiently at least two or more.

The power supply circuit 4 is provided with a DC/DC converter 40, and generates a driving voltage Vd (DC voltage) that the driving section 3 uses to drive the emission section 2 on the basis of an input voltage Vin supplied as a DC voltage.

The driving section 3 is provided with a driving circuit 30 and a driving control section 31.

The driving circuit 30 includes a driving transistor Q1 and a switch SW for each light-emitting element 2a, as well as a transistor Q2 and a constant current source 30a.

A field-effect transistor (FET) is used for the driving transistor Q1 and the transistor Q2, and in this example, a P-channel metal-oxide-semiconductor (MOS) FET, or MOSFET, is used.

The driving transistors Q1 are connected in a parallel relationship with respect to the output line of the DC/DC converter 40, or in other words the supply line of the driving voltage Vd, and the transistor Q2 is connected in parallel with the driving transistors Q1.

Specifically, the source of each of the driving transistors Q1 and the transistor Q2 is connected to the output line of the DC/DC converter 40. The drain of each driving transistor Q1 is connected to the anode of a corresponding light-emitting element 2a among the light-emitting elements 2a in the emission section 2.

As illustrated in the diagram, the cathode of each light-emitting element 2a is connected to ground (GND).

The drain of the transistor Q2 is connected to ground through the constant current source 30a, while the gate is connected to the node between the drain and the constant current source 30a.

The gate of each driving transistor Q1 is connected to the gate of the transistor Q2 through a corresponding switch SW.

In the driving circuit 30 having the above configuration, the driving transistors Q1 whose switch SW is ON are electrically conductive, the driving voltage Vd is applied to the light-emitting elements 2a connected to the electrically conductive driving transistors Q1, and the light-emitting elements 2a emit light.

At this time, a driving current Id flows to the light-emitting elements 2a, but in the driving circuit 30 having the above configuration, the driving transistors Q1 and the transistor Q2 form a current mirror circuit, and the current value of the driving current Id is set to a value corresponding to the current value of the constant current source 30a.

By controlling the ON/OFF state of the switches SW in the driving circuit 30, the driving control section 31 controls the ON/OFF state of the light-emitting elements 2a.

The frame synchronization signal Fs is supplied to the driving control section 31 by the image sensor 7, thereby enabling the driving control section 31 to synchronize the ON timings and OFF timings of the light-emitting elements 2a with the frame cycle of the image sensor 7.

Additionally, the driving control section 31 is capable of controlling the ON/OFF state of the light-emitting elements 2a on the basis of an instruction from the control section 9.

Additionally, the driving control section 31 in this example controls the ON/OFF state of the light-emitting elements 2a on the basis of the temperature of the emission section 2 detected by the temperature detection section 10.

Figure 4:
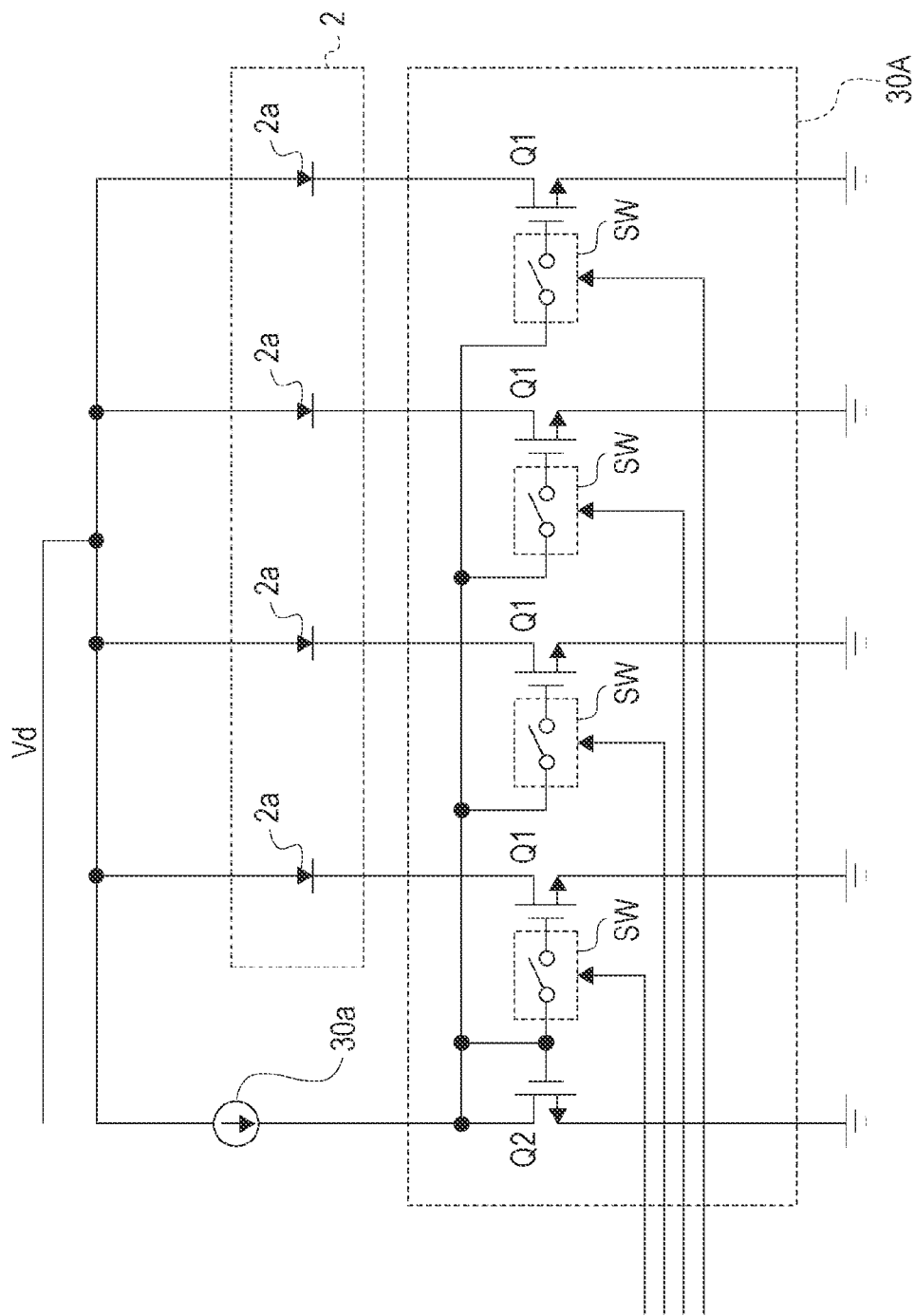
FIG. 4 is a diagram illustrating a modification of a driving circuit provided in the light source apparatus as an embodiment.

Here, FIG. 3 illustrates an example of a configuration in which the driving transistors Q1 are provided on the anode side of the light-emitting elements 2a, but like the driving circuit 30A illustrated in FIG. 4, a configuration in which the driving transistors Q1 are provided on the cathode side of the light-emitting elements 2a is also possible.

In this case, the anode of each light-emitting element 2a in the emission section 2 is connected to the output line of the DC/DC converter 40.

For each of the driving transistors Q1 and the transistor Q2 forming a current mirror circuit, an N-channel MOSFET is used. The drain and the gate of the transistor Q2 is connected to the output line of the DC/DC converter 40 through the constant current source 30a, while the source is connected to ground.

The drain of each driving transistor Q1 is connected to the cathode of the corresponding light-emitting element 2a, while the source is connected to ground. The gate of each driving transistor Q1 is connected to the gate and the drain of the transistor Q2 through each corresponding switch SW.

In this case as well, by controlling the ON/OFF state of the switches SW, the driving control section 31 can turn the light-emitting elements 2a ON/OFF.

Figure 5:
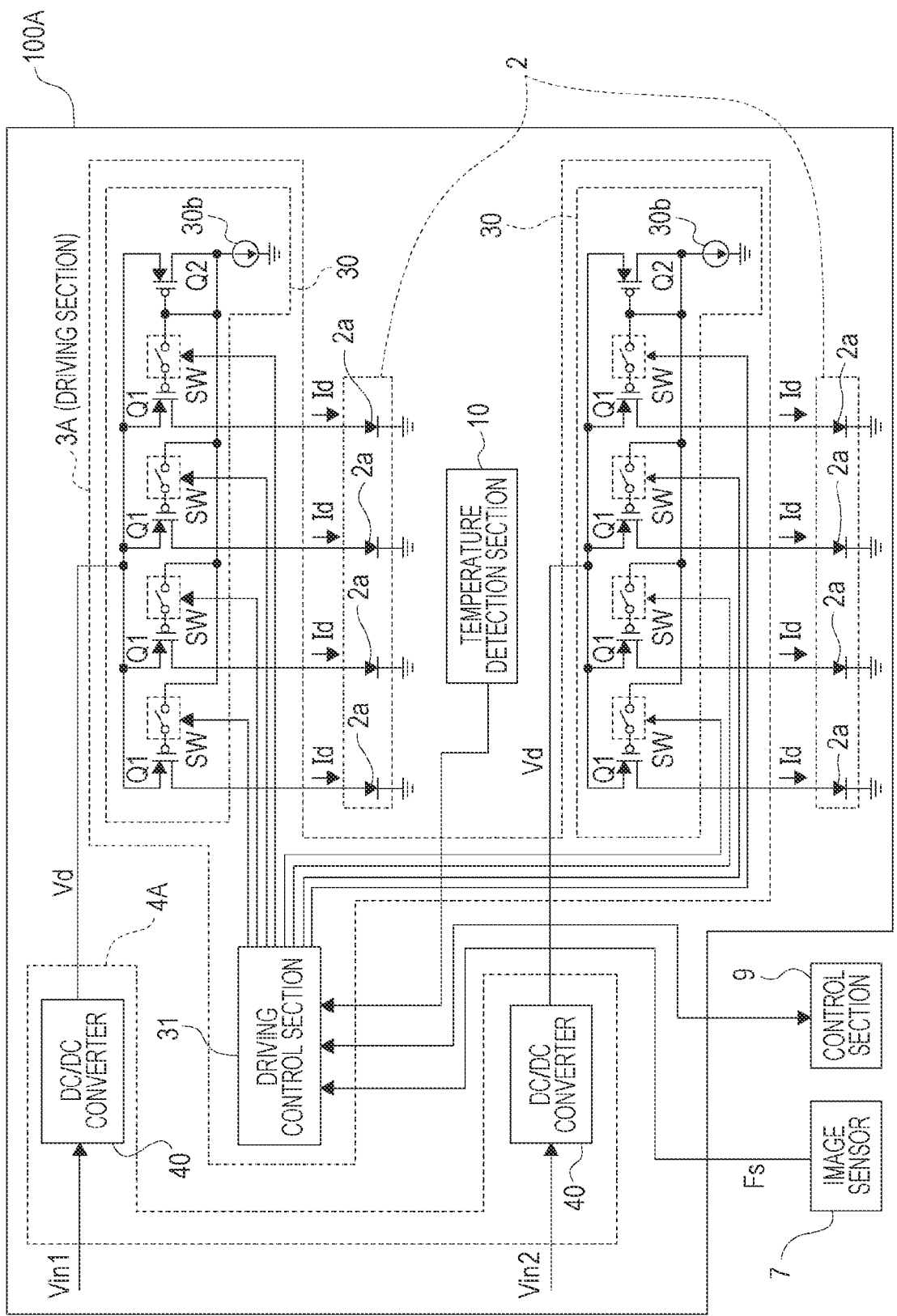
FIG. 5 is a diagram illustrating a circuit configuration as a modification of the light source apparatus as an embodiment.

FIG. 5 illustrates an exemplary configuration of a light source apparatus 100A as a modification.

The light source apparatus 100A is provided with a power supply circuit 4A instead of the power supply circuit 4 and a driving section 3A instead of the driving section 3.

The power supply circuit 4A includes multiple (in the illustrated example, two) DC/DC converters 40. An input voltage Vin1 is supplied to DC/DC converter 40, while an input voltage Vin2 is supplied to the other DC/DC converter 40. The driving section 3A is provided with multiple driving circuits 30 that accept the input of the driving voltage Vd from the respectively different DC/DC converters 40. As illustrated in the diagram, in each driving circuit 30, a variable current source 30b is provided instead of the constant current source 30a. The variable current source 30b is a current source having a variable current value.

In this case, the light-emitting elements 2a in the emission section 2 are divided into multiple light-emitting element groups whose states are controlled ON/OFF by different driving circuits 30.

The driving control section 31 in this case controls the ON/OFF state of the switches SW in each driving circuit 30.

Like the light source apparatus 100A, by taking a configuration in which at least the pair of the DC/DC converter 40 and the driving circuit 30 are reproduced as multiple subsystems, the driving current Id of the light-emitting elements 2a can be set to a different value for each subsystem. For example, by causing the voltage value of the driving voltage Vd and the current value of the variable current source 30b to be different for each subsystem, the value of the driving current Id can be made different for each subsystem. Also, in a configuration in which the DC/DC converter 40 keeps the driving current Id constant, by making the target value of the constant current control different for each DC/DC converter 40, the value of the driving current Id can be made difference for each subsystem.

In the case of adopting a configuration like FIG. 5, it is conceivable to make the values of the driving voltage Vd and the driving current Id different for each subsystem according to factors such as the emission intensity distribution and the temperature distribution in the emission section 2. For example, it is conceivable to take measures such as increasing the driving current Id and also raising the driving voltage Vd for a subsystem corresponding to a high-temperature location in the emission section 2.

4. VARIATIONS IN SUBSTRATE CONFIGURATION

Here, the light source apparatus 100 may take the configurations illustrated in FIGS. 6A, 6B, 7A, 7B, 70, 8A, and 8B.

Figure 6A:
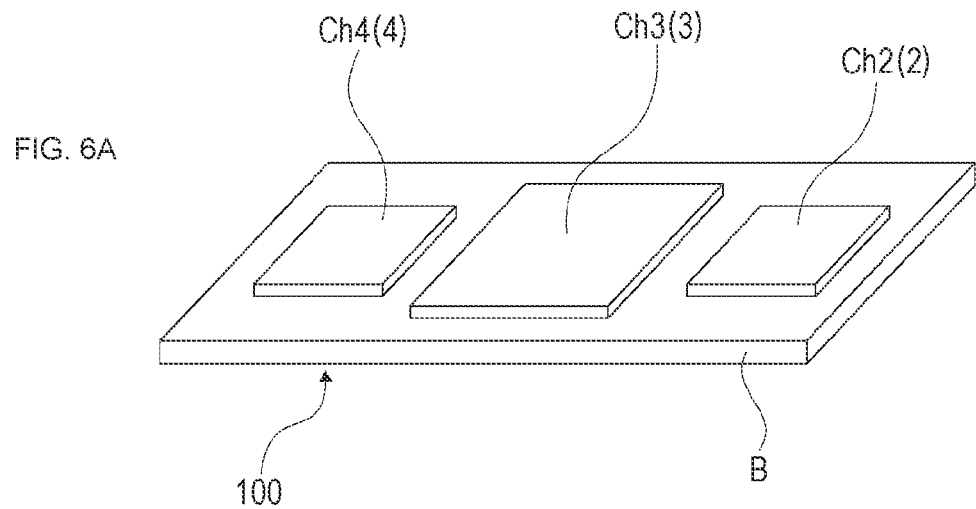
FIGS. 6A and 6B are diagrams illustrating an exemplary substrate configuration of the light source apparatus as an embodiment.

As illustrated in FIG. 6A, the light source apparatus 100 may take a configuration in which a chip Ch2 containing a circuit that acts as the emission section 2, a chip Ch3 containing a circuit that acts as the driving section 3, and a chip Ch4 containing the power supply circuit 4 are formed on the same substrate B.

Figure 6B:
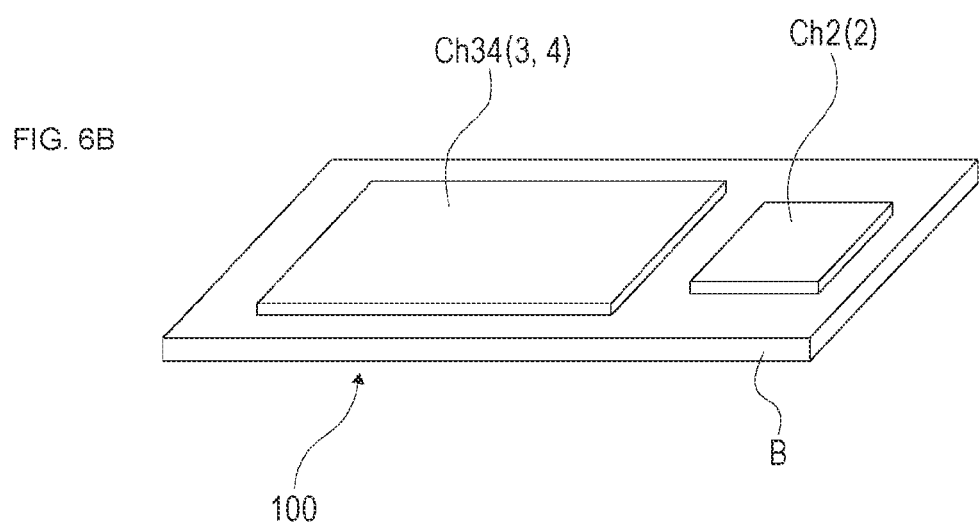

Additionally, the driving section 3 and the power supply circuit 4 may also be formed in the same chip Ch34, and in this case, the light source apparatus 100 may take a configuration in which the chip Ch2 and the chip Ch34 are formed on the same substrate B, as illustrated in Fig. 6B.

It is also possible to take a configuration in which a chip Ch is mounted on another chip Ch.

Figure 7A:
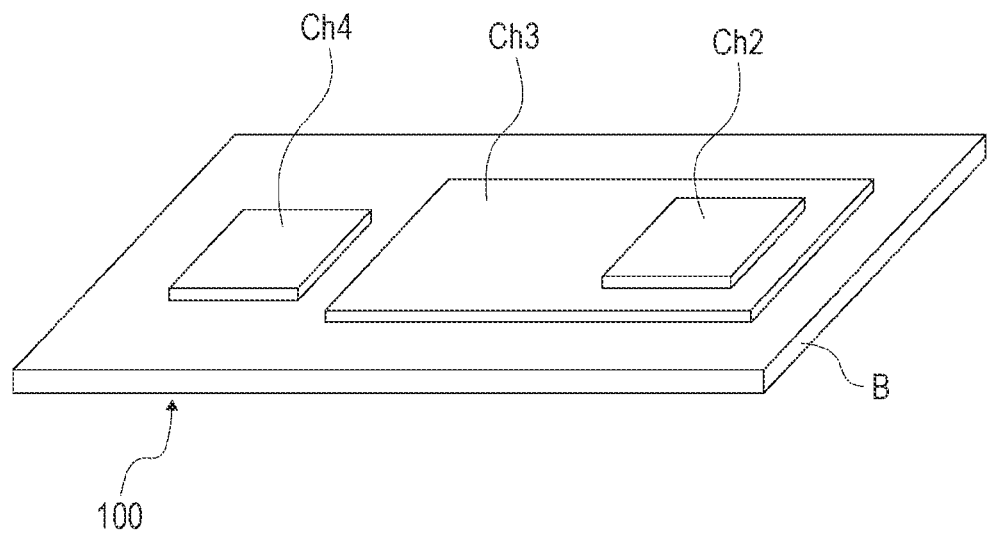
FIGS. 7A, 7B, and 7C are diagrams illustrating another exemplary substrate configuration of the light source apparatus as an embodiment.
Figure 7B:
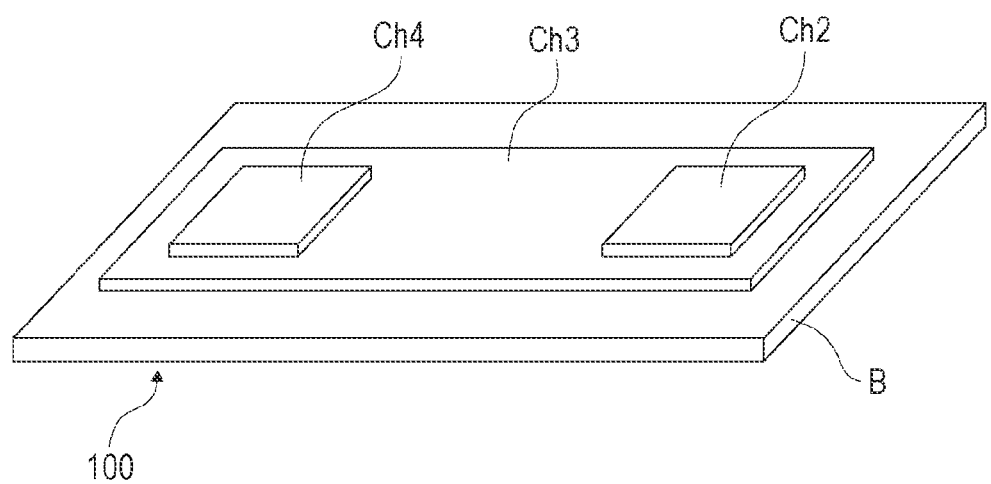
Figure 7C:
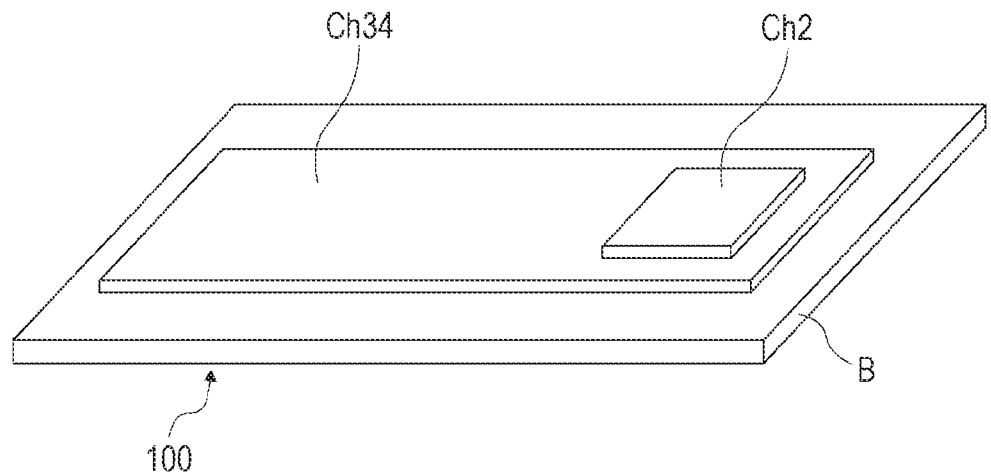

In this case, the light source apparatus 100 may take a configuration in which the chip Ch3 having the chip Ch2 mounted thereon and the chip Ch4 are formed on the substrate B like in FIG. 7A, a configuration in which the chip Ch3 having the chip Ch2 and the chip Ch4 mounted thereon is formed on the substrate B like in FIG. 7B, or a configuration in which the chip Ch34 having the chip Ch2 mounted thereon is formed on the substrate B like in FIG. 7C, for example.

Additionally, the light source apparatus 100 may also take a configuration that includes the image sensor 7.

For example, FIG. 8A illustrates an example of a configuration of the light source apparatus 100 in which the chip Ch2, the chip Ch3, and the chip Ch4 as well as a chip Ch7 containing a circuit that acts as the image sensor 7 are formed on the same substrate B.

Also, FIG. 8B illustrates an example of a configuration of the light source apparatus 100 in which the chip Ch34 having the chip Ch2 mounted thereon and the chip Ch7 are formed on the same substrate B.

Note that the light source apparatus 100A described above likewise may adopt a configuration similar to those described using FIGS. 6A, 6B, 7A, 7B, 7C, 8A and 8B.

Here, regarding the temperature detection section 10, in the case where the chip Ch2 is formed on the substrate B like in FIGS. 6A, 6B, and 8A for example, it is sufficient to form temperature detection elements such as diodes at positions near the chip Ch2 in the substrate B (such as positions beside the chip Ch2 on the substrate B, for example).

Also, in the case where the chip Ch2 is mounted onto another chip Ch like in FIGS. 7A, 7B, and 7C and FIG. 8B, it is sufficient to form the temperature detection elements at positions near the chip Ch2 in the other chip Ch (such as positions underneath of the chip Ch2, for example).

The temperature detection section 10 may include a plurality of temperature sensors 10a including temperature detection elements such as diodes.

Figure 9:
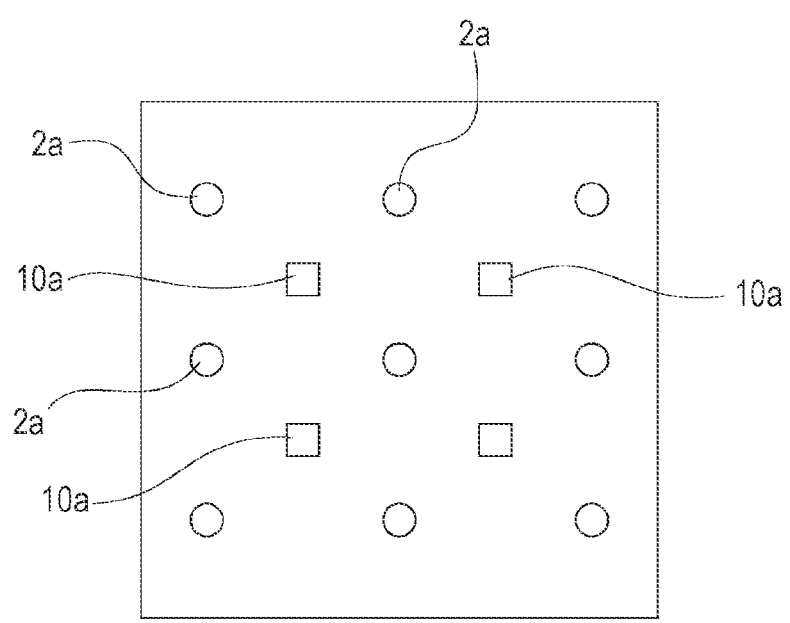
FIG. 9 is a diagram illustrating an exemplary arrangement of temperature sensors provided in the light source apparatus as an embodiment.

FIG. 9 illustrates an exemplary arrangement of the temperature sensors 10a in the case where the temperature detection section 10 includes a plurality of temperature sensors 10a.

In the example of FIG. 9, the plurality of temperature sensors 10a are not concentrated in a single location, but are dispersed in a plane parallel to the plane in which the light-emitting elements 2a are arrayed. Specifically, the plurality of temperature sensors 10a may be arranged such that one temperature sensor 10a is disposed for each emission block containing a predetermined number of light-emitting elements 2a, such as a 2×2 block containing a total of four light-emitting elements 2a, for example. In this case, the temperature sensors 10a may be arranged at equal intervals in a plane parallel to the plane in which the light-emitting elements 2a are arrayed.

Note that although FIG. 9 illustrates an example of arranging four temperature sensors 10a with respect to nine light-emitting elements 2a, but the number of disposed light-emitting elements 2a and the number of disposed temperature sensors 10a are not limited thereto.

Also, by dispersing the plurality of temperature sensors 10a like in the examples of FIG. 9, it is possible to detect an in-plane temperature distribution of the emission section 2. In addition, different temperatures can be detected for different areas of the emission surface, and furthermore, by increasing the number of disposed temperature sensors 10a, it is also possible to detect different temperatures for each of the light-emitting elements 2a.

5. EXEMPLARY VCSEL STRUCTURE

Next, an exemplary structure of the chip Ch2 in which the emission section 2 is formed will be described with reference to FIGS. 10 and 11.

Figure 10:
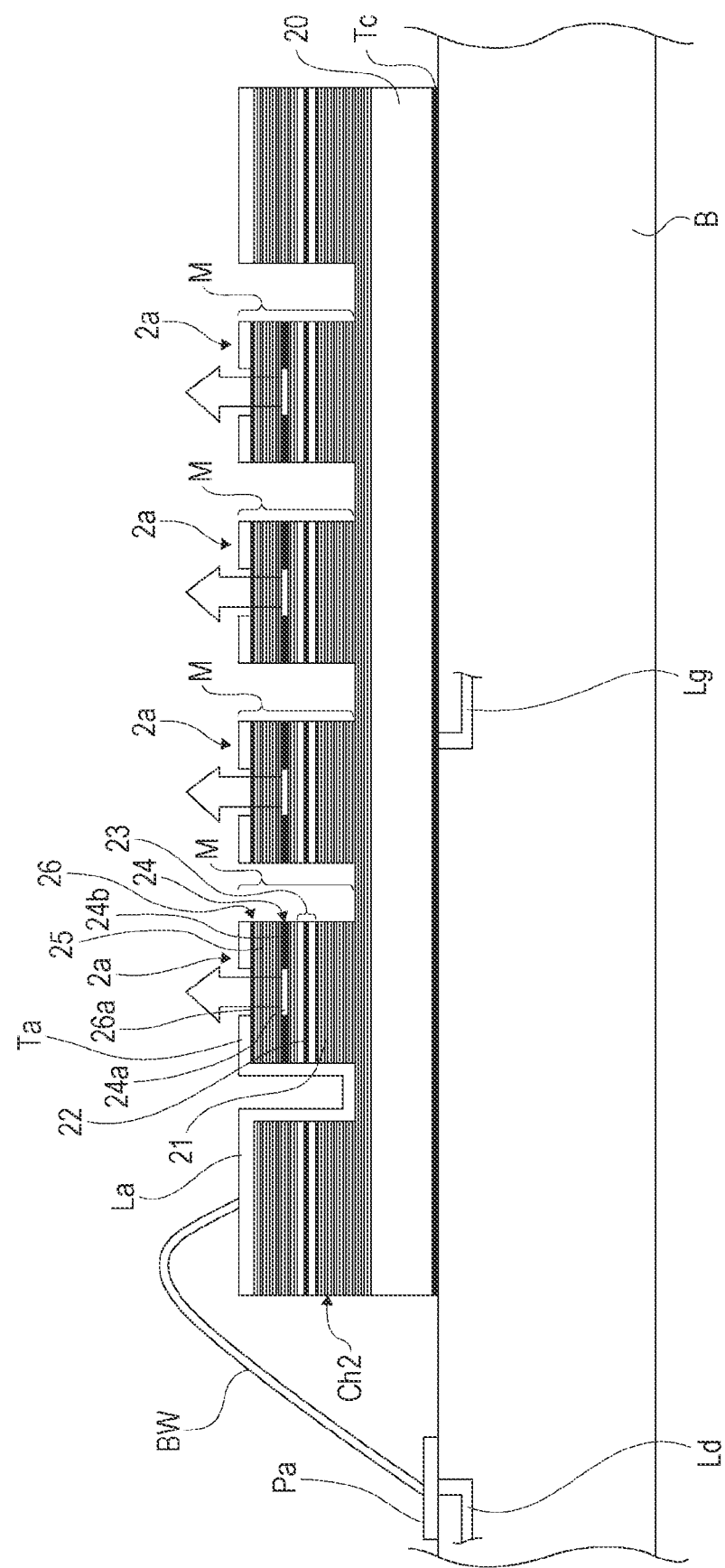
FIG. 10 is a diagram illustrating an exemplary structure of an emission section provided in the light source apparatus as an embodiment.
Figure 11:
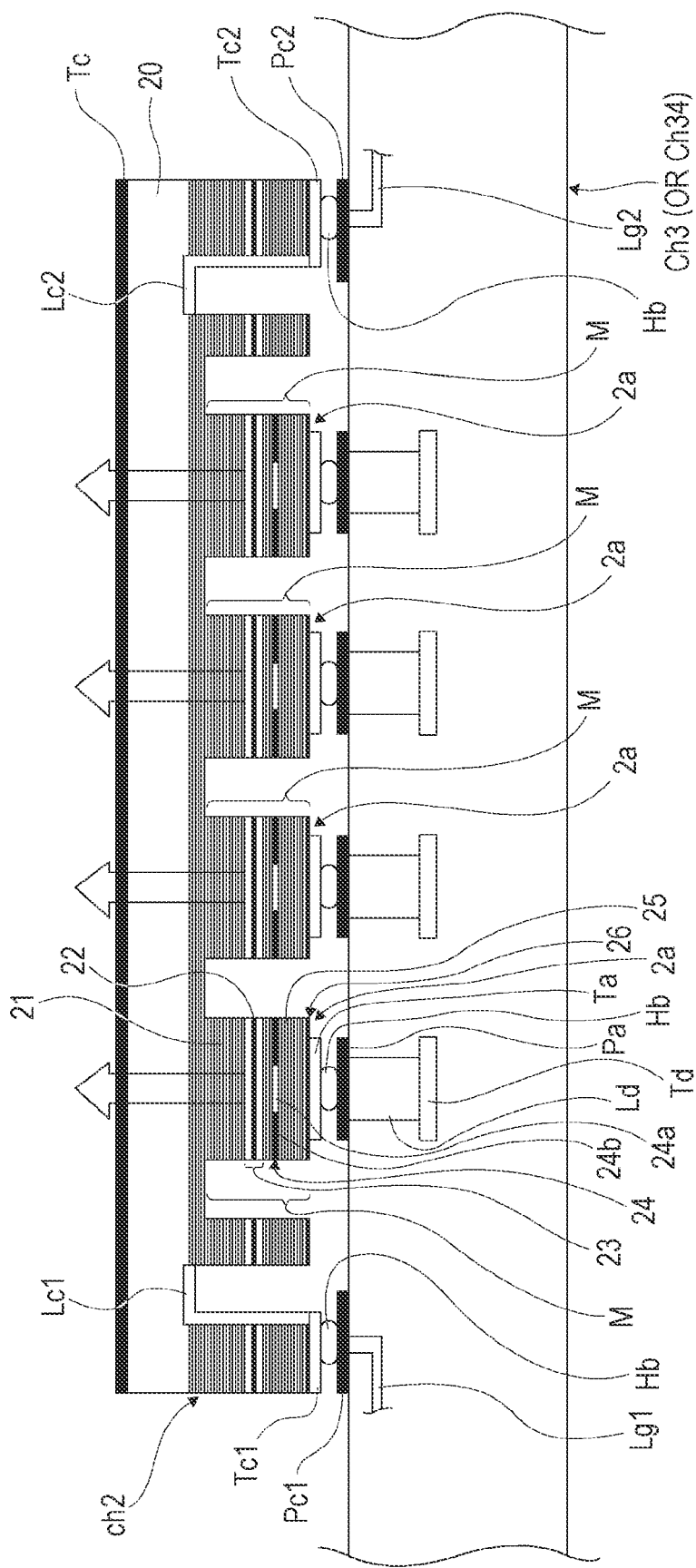
FIG. 11 is a diagram illustrating another exemplary structure of an emission section provided in the light source apparatus as an embodiment.

FIG. 10 illustrates an exemplary structure of the chip Ch2 in the case of being formed on the substrate B like in FIGS. 6A, 6B, and 8A, while FIG. 11 illustrates an exemplary structure of the chip Ch2 in the case of being mounted onto another chip Ch like in FIGS. 7A, 7B, and 7C and 8B.

Note that, as an example, FIGS. 10 and 11 illustrate an exemplary structure corresponding to the case where the driving circuit 30 is inserted on the anode side of the light-emitting elements 2a (see FIG. 3).

As illustrated in FIG. 10, in the chip Ch2, the portions corresponding to each of the light-emitting elements 2a are formed as mesas M.

A semiconductor substrate 20 is used as the substrate of the chip Ch2, and a cathode electrode Tc is formed on the underside of the semiconductor substrate 20. For the semiconductor substrate 20, a gallium arsenide (GaAs) substrate is used, for example.

On the semiconductor substrate 20, in each mesa M, a first multilayer reflective layer 21, an active layer 22, a second multilayer reflective layer 25, a contact layer 26, and an anode electrode Ta are formed in order from bottom to top.

A current constriction layer 24 is formed in a part (specifically the lower part) of the second multilayer reflective layer 25. Also, the portion including the active layer 22 that is sandwiched between the first multilayer reflective layer 21 and the second multilayer reflective layer 25 acts as a resonator 23.

The first multilayer reflective layer 21 is formed using a compound semiconductor exhibiting N-type conductivity, while the second multilayer reflective layer 25 is formed using a compound semiconductor exhibiting P-type conductivity.

The active layer 22 acts as a layer for generating laser light, while the current constriction layer 24 acts as a layer that injects current efficiently into the active layer 22 and achieves a lens effect.

After the mesas M are formed, the current constriction layer 24 is subjected to selective oxidation in the unoxidized state, and includes a central oxidized region (also referred to as a selectively oxidized region) 24a and an unoxidized region 24b that is not oxidized in the periphery of the oxidized region 24a. In the current constriction layer 24, a current constricting structure is formed by the oxidized region 24a and the unoxidized region 24b, and current is conducted to the current constriction region as the unoxidized region 24b.

The contact layer 26 is provided to ensure an ohmic contact with the anode electrode Ta.

The anode electrode Ta is formed on the contact layer 26 in an annular (ring) shape or the like that is open in the center for example when looking at a plan view of the substrate B. In the contact layer 26, the portion where the anode electrode Ta is not formed on top acts as an opening 26a.

Light generated in the active layer 22 travels back and forth inside the resonator 23 and then is emitted to the outside through the opening 26a.

Here, the cathode electrode Tc in the chip Ch2 is connected to ground through a ground lead Lg formed in a wiring layer of the substrate B.

Also, in the diagram, a pad Pa represents a pad for the anode electrode formed on the substrate B. The pad Pa is connected to the drain of any one of the driving transistors Q1 included in the driving circuit 30 through a lead Ld formed in the wiring layer of the substrate B.

In the diagram, the anode electrode Ta is illustrated as being connected to the single pad Pa through an anode lead La formed on the chip Ch2 and a bonding wire BW for only one light-emitting element 2a, but the pad Pa and the lead Ld are formed for each light-emitting element 2a on the substrate B, and furthermore, the anode lead La is formed for each of the light-emitting elements 2a on the chip Ch2, and the anode electrodes Ta of the individual light-emitting elements 2a are connected to the corresponding pad Pa through the corresponding anode lead La and bonding wire BW.

Next, in the case of FIG. 11, a back-illumination chip Ch2 is used as the chip Ch2. In other words, rather than emitting light in the upward direction (surface direction) of the semiconductor substrate 20 like the example in FIG. 10, a chip Ch2 of a type that emits light in the back direction of the semiconductor substrate 20.

In this case, an opening for emitting light is not formed in the anode electrode Ta, and the opening 26a is not formed in the contact layer 26.

In the chip Ch3 (or the chip Ch34; the same applies hereinafter in the description of FIG. 11) in which the driving section 3 (driving circuit 30) is formed, the pad Pa for establishing an electrical connection with the anode electrode Ta is formed for each light-emitting element 2a. In the wiring layer of the chip Ch3, the lead Ld is formed for each pad Pa. Although omitted from illustration, each of the pads Pa is connected, by these leads Ld, to the drain of a corresponding driving transistor Q1 in the driving circuit 30 formed in the chip Ch3.

Also, in the chip Ch2, the cathode electrode Tc is connected to an electrode Tc1 and an electrode Tc2 via leads Lc1 and Lc2, respectively. The electrode Tc1 and the electrode Tc2 are electrodes for respectively connecting with a pad Pc1 and a pad Pc2 formed in the chip Ch3.

In the wiring layer of the chip Ch3, a ground lead Lg1 connected to the pad Pc1 and a ground lead Lg2 connected to the pad Pc2 are formed. Although not illustrated, these ground leads Lg1 and Lg2 are connected to ground.

The connections between each anode electrode Ta in the chip Ch2 and each pad Pa in the chip Ch3 as well as the connections between the electrodes Tc1 and Tc2 in the chip Ch2 and the pads Pc1 and Pc2 in the chip Ch3 are established through respective solder bumps Hb.

In other words, the mounting of the chip Ch2 on the chip Ch3 in this case is achieved by what is called flip chip mounting.

6. Arrangement Relationship Between Light-Emitting Elements and Driving Transistors Next, FIGS. 12A, 12B, 13A, 13B, 14A, 14B, 14C, 15A and 15B will be used to describe the arrangement relationship between the emission section 2 and the driving circuit 30 in the case where the chip Ch2 is mounted onto the chip Ch3 (or the chip Ch34; the same applies to the description hereinafter) as illustrated in FIGS. 7A, 7B, and 7C and 8B in the light source apparatus 100.

In the present embodiment, a back-illumination chip Ch2 like the one illustrated in FIG. 11 is used as an example. In this example, a structure corresponding to the case where the driving circuit 30 is inserted on the anode side of the light-emitting elements 2a as illustrated in FIG. 3 is adopted.

Note that the chip Ch2 is not limited to the back-illumination type, and a structure like the one illustrated in FIG. 10 may also be adopted. Additionally, it is also possible to take a configuration in which the driving transistors Q1 are provided on the cathode side of the light-emitting elements 2a, like the driving circuit 30A illustrated in FIG. 4.

In the driving circuit 30 of the driving section 3 in FIG. 3, the driving transistors Q1 whose switch SW is ON are electrically conductive, the driving voltage Vd is applied to the light-emitting elements 2a of the emission section 2 connected to the electrically conductive driving transistors Q1, and the light-emitting elements 2a emit light.

When measuring distance by causing the emission section 2 in which a plurality of VCSEL light-emitting elements 2a is arrayed to emit light like the distance measuring apparatus 1 described above, the plurality of light-emitting elements 2a is made to emit light simultaneously or by time division.

When executing such light emission, the driving transistors Q1 in the driving circuit 30 of the chip Ch3 generate heat, which causes the temperature of the chip Ch2 in which the light-emitting elements 2a are formed to rise easily, and depending on the ambient temperature, this may lead to a heat-induced malfunction such as a drop in the emission efficiency of the light-emitting elements 2a.

Also, the temperature of the light-emitting elements 2a rises due to emission, and generated heat may lead to degraded circuit characteristics in the driving circuit 30 that drives the light-emitting elements 2a.

Figure 12A:
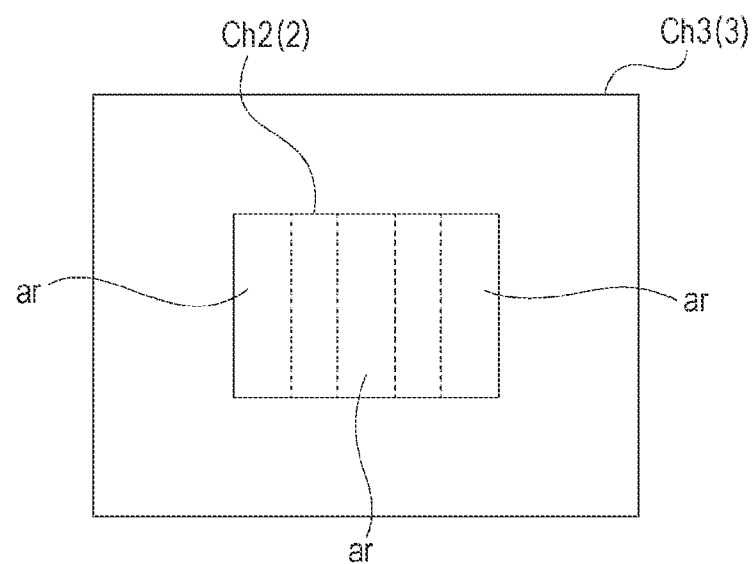
FIGS. 12A and 12B are diagrams illustrating an arrangement relationship between the emission section and a driving section as an embodiment.
Figure 12B:
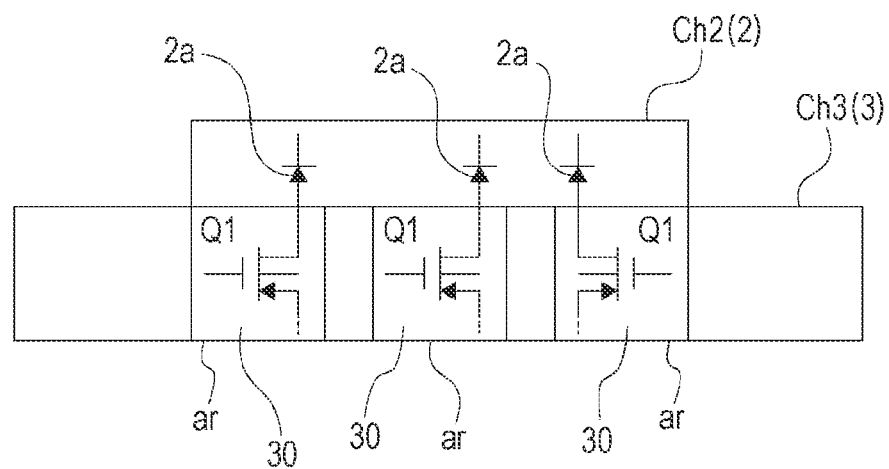

Accordingly, FIGS. 12A and 12B will be used to describe the arrangement relationship between the emission section 2 (chip Ch2) and the driving section 3 (chip Ch3) for avoiding interference due to mutual heat. FIG. 12A is a diagram schematically illustrating the arrangement relationship between the chip Ch2 and the chip Ch3 provided on the substrate B, and FIG. 12B is a diagram schematically illustrating a cross section of the internal structure of the chip Ch3 with the chip Ch2 mounted thereon.

As illustrated in FIG. 12A, in the state in which the chip Ch2 is mounted onto the chip Ch3, three regions (hereinafter also referred to as driving transistor placement regions ar) containing the driving transistors Q1 for causing each light-emitting element 2a to emit light are provided in the chip Ch3. As illustrated in FIG. 12B, the plurality of driving transistors Q1 is provided in the driving circuit 30 in each of the driving transistor placement regions ar. In this diagram, all of the driving transistor placement regions ar are provided at positions overlapping the planar face of the chip Ch2.

Note that although an example of providing three driving transistor placement regions ar is described as an example herein for convenience of illustration, the driving transistor placement regions ar are not limited to three, and it is possible to provide a one or a plurality of driving transistor placement regions ar (the same applies to the description hereinafter).

In such a configuration, in a case where the plurality of light-emitting elements 2a are made to emit light simultaneously or by time division, the corresponding driving transistor placement regions ar generate heat. Consequently, the temperature of the chip Ch2 contacting the driving transistor placement regions ar rises in association with this generation of heat.

Additionally, heat is generated by the simultaneous or time-division emission of light by the plurality of light-emitting elements 2a provided in the emission section 2, and this heat causes the temperature of the driving circuits 30 contained in the driving transistor placement regions ar to rise.

Accordingly, in the present embodiment, the driving transistor placement regions ar are disposed at positions that do not overlap with the chip Ch2 containing the light-emitting elements 2a.

Figure 13A:
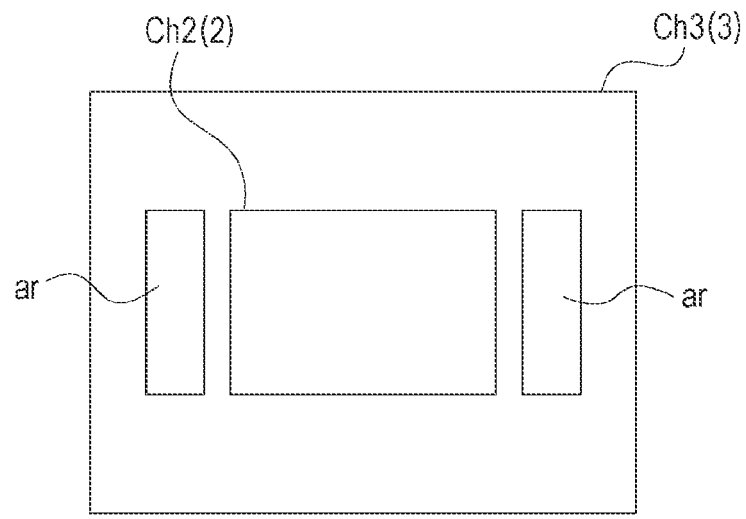
FIGS. 13A and 13B are diagrams illustrating another arrangement relationship between the emission section and the driving section as an embodiment.
Figure 13B:
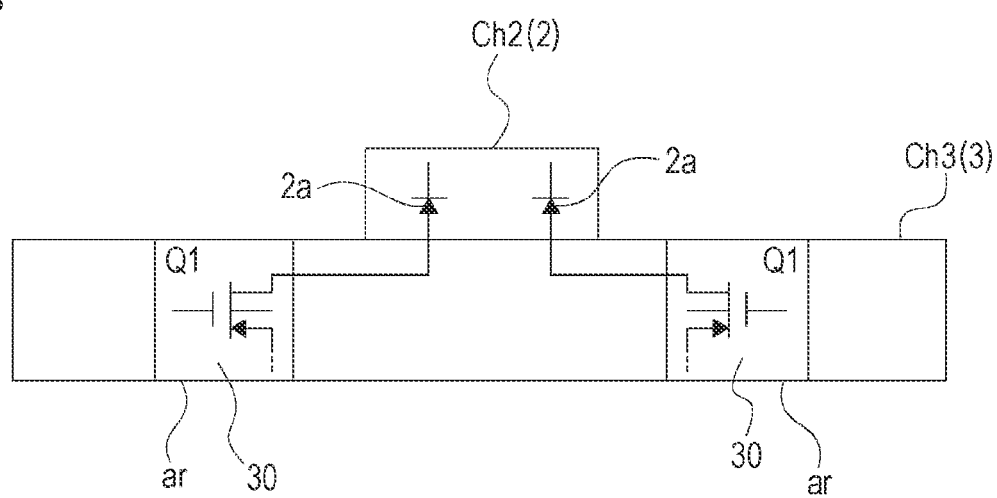

FIGS. 13A and 13B illustrate an example of the arrangement. FIG. 13A is a diagram schematically illustrating the arrangement relationship between the chip Ch2 and the chip Ch3, and FIG. 13B is a diagram schematically illustrating a cross section of the internal structure of the chip Ch3 with the chip Ch2 mounted thereon.

As illustrated in FIGS. 13A and 13B, two driving transistor placement regions ar are provided in the chip Ch3, and the driving transistor placement regions ar are disposed facing each other with the chip Ch2 in between. At this time, the driving transistor placement regions ar are disposed so as not to overlap with the planar face of the chip Ch2 (emission section 2).

In this way, by disposing the driving transistor placement regions ar at positions not below the underside of the chip Ch2, the distance between the driving transistors Q1 of the driving transistor placement regions ar and the chip Ch2 is increased, and the influence on the emission section 2 caused by the heat generated by the driving transistors Q1 can be reduced. Furthermore, the influence on the driving circuit 30 of the driving transistor placement regions ar caused by the heat generated when the light-emitting elements 2a provided in the emission section 2 emit light can be reduced.

In this way, because the influence of heat can be reduced by disposing the driving transistor placement regions ar at positions distanced from the light-emitting elements 2a of the emission section 2 that generate heat, it is also possible for a portion of the emission section 2 (chip Ch2) to be mounted onto the driving section 3 (chip Ch3) so as to overlap the driving transistor placement regions ar, insofar as the light-emitting elements 2a are arranged so as not to overlap with the driving transistor placement regions ar.

Similarly, because the influence of heat can be reduced by disposing the emission section 2 at a position distanced from the driving transistors Q1 of the driving transistor placement regions ar that generate heat, it is also possible for the emission section 2 (chip Ch2) to be mounted onto the driving section 3 (chip Ch3) so as to overlap a portion of the driving transistor placement regions ar, insofar as the driving transistors Q1 are arranged so as not to overlap with the emission section 2.

Furthermore, to keep the heat from being concentrated in a single location, when mounting the emission section 2 (chip Ch2) onto the driving section 3 (chip Ch3), it is desirable to arrange the light-emitting elements 2a and the driving transistors Q1 so as not to overlap each other.

Also, by disposing the disposed driving transistor placement regions ar in a plurally dispersed manner, such as by disposing the driving transistor placement regions ar at positions facing each other with the chip Ch2 in between like in FIG. 13A, the heat dissipation of each driving transistor placement region ar is improved, and a temperature rise in the driving transistors Q1 can be moderated. With this arrangement, the influence on the chip Ch2 caused by the heat generated by the driving transistors Q1 can be reduced.

Figure 14A:
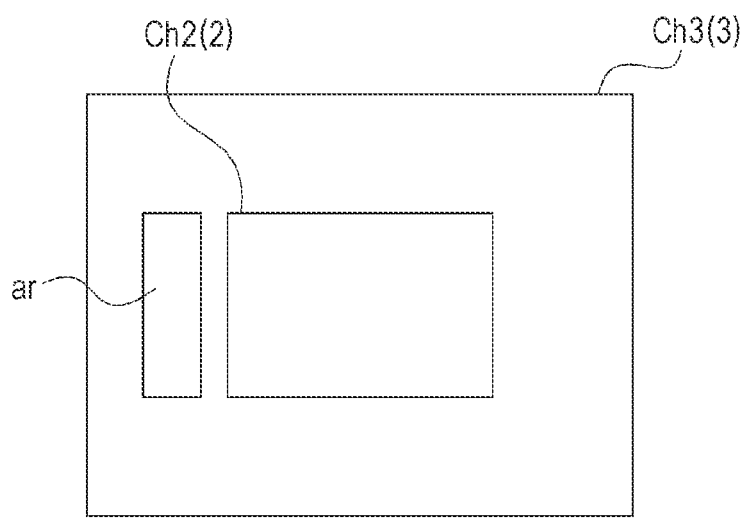
FIGS. 14A, 14B, and 14C are diagrams illustrating exemplary arrangements of the emission section and the driving section as an embodiment.
Figure 14B:
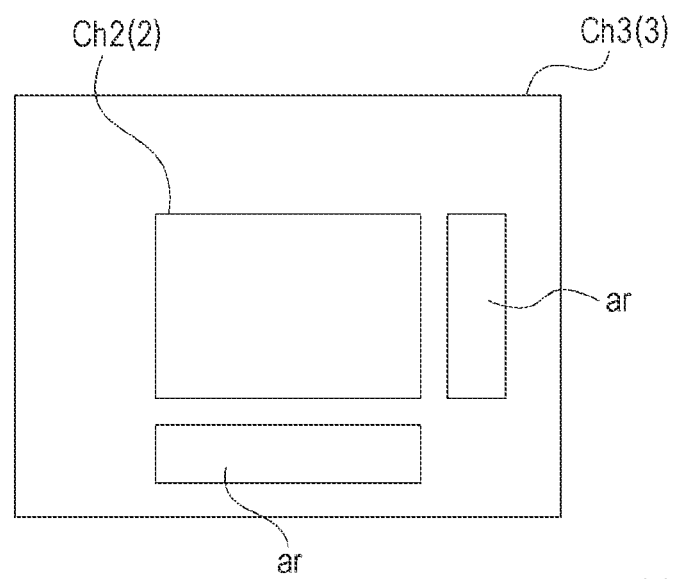
Figure 14C:
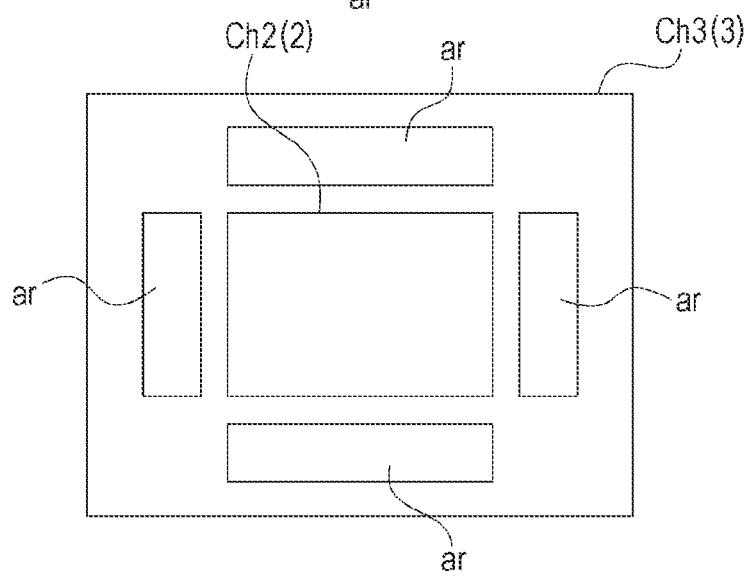

Note that the positions of the driving transistor placement regions ar in the chip Ch3 are not limited to the above, and a variety of modes are conceivable. FIGS. 14A, 14B, and 14C illustrate examples of arrangements of the driving transistor placement regions ar in the chip Ch3.

For example, as illustrated in FIG. 14A, the driving transistor placement regions ar may be disposed in a single combined region in the chip Ch3 at a position that does not overlap with the chip Ch2.

Also, as illustrated in FIG. 14B, the driving transistor placement regions ar may be disposed along a first edge of the chip Ch2 and also along an edge adjacent to the first edge.

Furthermore, as illustrated in FIG. 14C, it is also conceivable to dispose the driving transistor placement regions ar to surround the chip Ch2.

Also, the driving transistors Q1 in all of the driving transistor placement regions ar do not necessarily need to be provided so as not to overlap with the chip Ch2. In other words, as long as the temperature rise in the chip Ch2 does not exceed a value that would cause a malfunction, the driving transistor placement regions ar may also be provided so as to overlap with the chip Ch2.

Figure 15A:
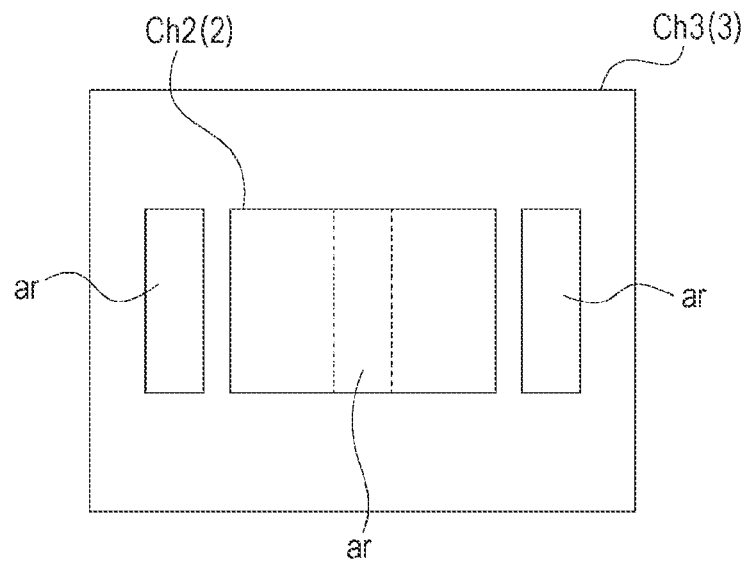
FIGS. 15A and 15B are diagrams illustrating another arrangement relationship between the emission section and the driving section as an embodiment.
Figure 15B:
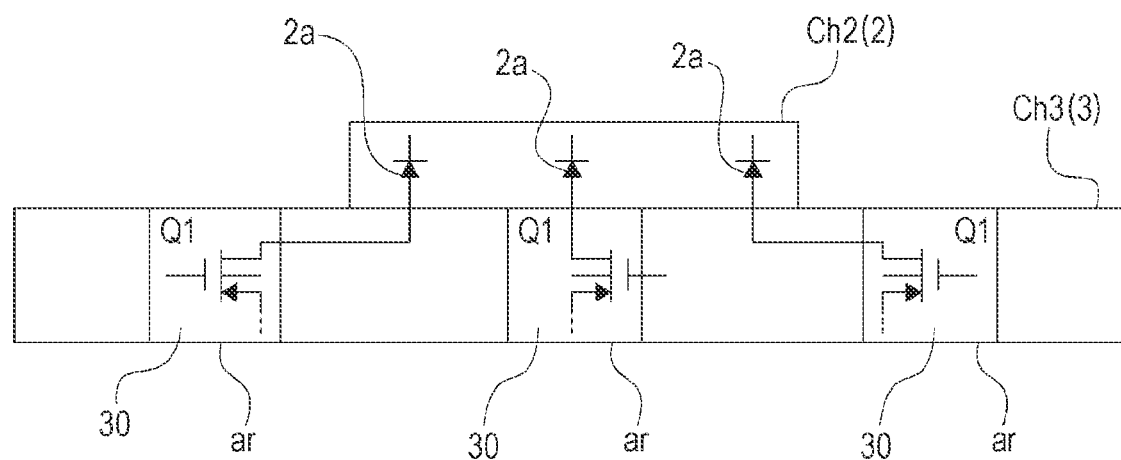

As illustrated in FIGS. 15A and 15B for example, in the case where three driving transistor placement regions ar are provided in the chip Ch3, two of the driving transistor placement regions ar may be provided at positions facing each other with the chip Ch2 in between, while the remaining single driving transistor placement region ar may be provided so as to overlap with the chip Ch2 (emission section 2). In this case, some of the driving transistors Q1 are disposed at positions overlapping the chip Ch2.

7. Leads that Connect Light-Emitting Elements and Driving Transistors

Next, the structure of the leads Lt that electrically connect the light-emitting elements 2a and the driving transistors Q1 will be described using FIGS. 16A, 16B and 17. For the leads Lt, metal leads such as Cu leads are used, for example.

If the wiring resistance value of the leads Lt rises, the rising time of the signal pulses increases, which may cause phenomena such as an increase in power consumption due to ohmic loss and a rise in temperature associated therewith. Consequently, it is desirable to form the leads so as to moderate increases in the wiring resistance of the leads Lt.

Figure 16A:
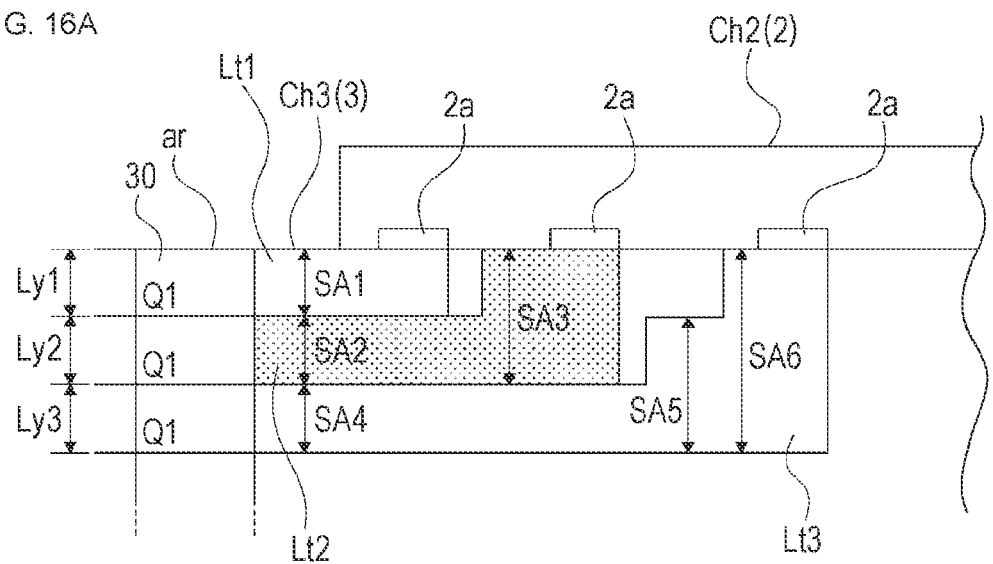
FIGS. 16A and 16B are diagrams for explaining leads that connect the emission section and the driving section as an embodiment.
Figure 16B:
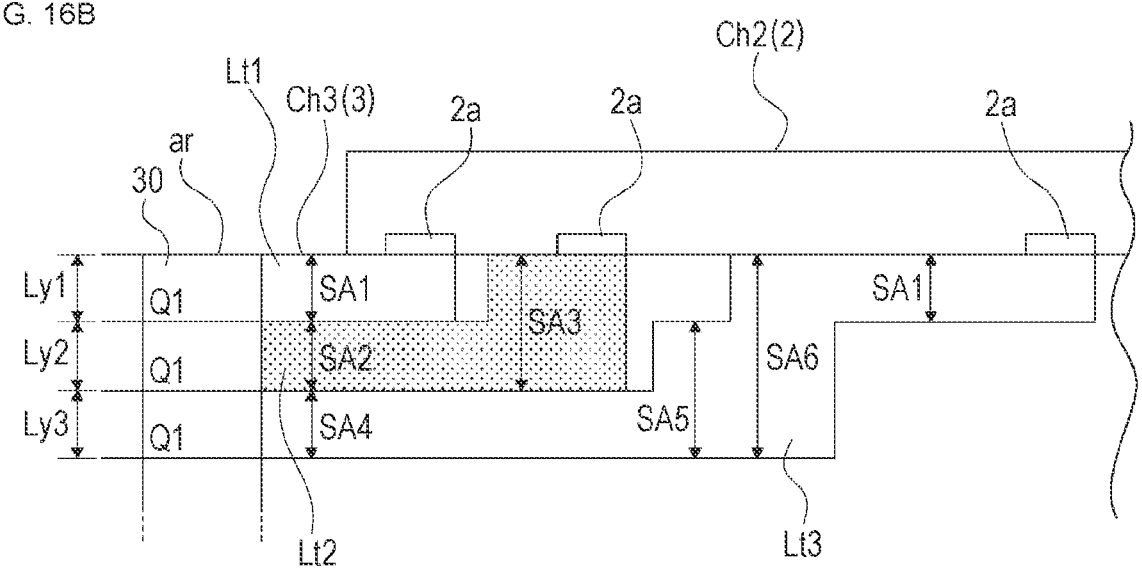

FIGS. 16A and 16B are diagrams schematically illustrating a cross section of the chip Ch3 with the chip Ch2 mounted thereon.

As illustrated in FIG. 16A, the chip Ch3 is formed in a multilayer structure, and includes a plurality of wiring layers Ly1, Ly2, Ly3, and so on. The chip Ch3 may also be configured as a single-layer structure, but a multilayer structure is desirable. Note that in the following, components such as insulating layers will be omitted from illustration to avoid confusion, and the driving transistors Q1 will be illustrated schematically.

The reason why the chip Ch3 has a multilayer structure is that the emission section 2 is provided with hundreds of light-emitting elements 2a, and if one attempts to provide the leads Lt for connecting these the light-emitting elements 2a to the driving transistors Q1 in a single-layer structure, the wiring cross-sectional area SA (hereinafter also simply referred to as the cross-sectional area SA) per lead Lt would become very small, making it difficult to secure enough area to moderate an increase in the wiring resistance of each lead Lt.

Here, the wiring cross-sectional area refers to the cross-sectional area when taking a cross section in a plane perpendicular to the extension direction of the lead. The extension direction means to the direction in which a lead Lt runs from a driving transistor Q1 to a light-emitting element 2a, and refers to the longitudinal direction of the lead Lt for example.

Although not illustrated, the chip Ch3 according to the present embodiment has seven wiring layers Ly.

In the driving transistor placement regions ar of the chip Ch3, the driving transistors Q1 are provided in each of the wiring layers Ly, and the drain of each driving transistor Q1 is connected to the anode of a corresponding light-emitting element 2a among the light-emitting elements 2a in the emission section 2 through a lead Lt.

A driving transistor Q1 provided in the uppermost wiring layer Ly1 is connected to a predetermined light-emitting element 2a positioned near the periphery of the chip Ch2 (that is, a light-emitting element 2a a short distance away from the driving transistor Q1) through a lead Lt1.

Also, a driving transistor Q1 provided in the wiring layer Ly2 below the wiring layer Ly1 is connected, through a lead Lt2, to a predetermined light-emitting element 2a positioned farther inward than the light-emitting element 2a connected in the wiring layer Ly1.

Further, a driving transistor Q1 provided in the wiring layer Ly3 below the wiring layer Ly2 is connected, through a lead Lt3, to a predetermined light-emitting element 2a positioned farther inward than the light-emitting element 2a connected in the wiring layer Ly2.

Consequently, as the wiring layers Ly proceed to lower layers, the distance from the driving transistors Q1 to the light-emitting elements 2a increases, and the length of the leads Lt connecting the driving transistors Q1 and the light-emitting elements 2a also increases correspondingly. Specifically, when comparing the lead Lt1 provided in the wiring layer Ly1, the lead Lt2 provided in the wiring layer Ly2, and the lead Lt3 provided in the wiring layer Ly3, the lead Lt2 is longer than the lead Lt1 and the lead Lt3 is longer than the lead Lt2.

In this way, by connecting the driving transistors Q1 in higher layers to light-emitting elements 2a a shorter distance away, a layout in which the leads Lt do not intersect each other is achieved easily. Consequently, it is possible to keep the wiring length from becoming longer than necessary to avoid intersections between the leads Lt, and as a result, an increase in the wiring resistance of the leads Lt can be moderated.

Also, as the lengths of the leads Lt increase in successively lower layers, the wiring resistance of the leads Lt connecting the light-emitting elements 2a and the driving transistors Q1 increases. Consequently, there are concerns about the occurrence of phenomena such as an increase in power consumption for causing the light-emitting elements 2a to emit light, and a rise in temperature associated therewith.

Accordingly, in the present embodiment, the wiring cross-sectional area SA of the leads Lt is enlarged according to the wiring length, and by enlarging the wiring cross-sectional area SA, an increase in the wiring resistance of the leads Lt is moderated. In FIG. 16A, cross-sectional areas SA1 to SA6 are illustrated for the leads Lt1 to Lt3 at any positions.

For example, in the lead Lt2, the wiring cross-sectional area SA changes from SA2 to SA3 as the wiring length becomes longer.

At this time, by causing the cross-sectional area SA3 to have a greater wiring width in the vertical direction (thickness direction) of the wiring layers Ly compared to the cross-sectional area SA2, the cross-sectional area SA3 is formed having a larger wiring cross-sectional area than the cross-sectional area SA2.

Similarly, the wiring cross-sectional area SA of the lead Lt3 changes from SA4 to SA5 and SA6 according to the wiring length, and by successively increasing the wiring width in the vertical direction (thickness direction) of the wiring layers Ly, the lead Lt3 is formed having a larger wiring cross-sectional area.

In addition, the wiring length increases further for the leads Lt provided in the lower wiring layers Ly as described above, and as a result, the leads Lt are formed having larger wiring cross-sectional areas SA. For example, the largest cross-sectional area SA6 of the lead Lt3 provided in the lower wiring layer Ly3 is larger than the largest cross-sectional area SA3 of the lead Lt2 provided in the wiring layer Ly2.

At this time, to enlarge the wiring cross-sectional area SA of the leads Lt, it is also conceivable to provide the leads Lt spanning a plurality of wiring layers. For example, when enlarging the lead Lt2 provided in the wiring layer Ly2 illustrated in FIG. 16A from the cross-sectional area SA2 to the cross-sectional area SA3, the surplus region in the wiring layer Ly1 can be used. In other words, by forming the lead Lt2 so as to span the wiring layer Ly2 and the wiring layer Ly1, the cross-sectional area SA3 can be enlarged more than the cross-sectional area SA2.

Similarly, when enlarging the lead Lt3 provided in the wiring layer Ly3 from the cross-sectional area SA4 to the cross-sectional area SA5, the surplus region in the wiring layer Ly2 can be used in addition to the wiring layer Ly3. Also, when enlarging the lead Lt3 formed spanning the wiring layer Ly3 and the wiring layer Ly2 from the cross-sectional area SA5 to the cross-sectional area SA6, the surplus region in the wiring layer Ly1 can be used in addition to the wiring layer Ly3 and the wiring layer Ly2 to form the leads Lt.

In this way, by utilizing the surplus regions of the wiring layers Ly to enlarge the wiring cross-sectional area SA, an increase in the wiring resistance of the leads Lt can be moderated.

Note that, as illustrated in FIG. 16B for example, the lead Lt3 that had been provided in the lower wiring layer Ly3 may also be disposed in the wiring layer Ly1 along the way.

FIG. 17 is a diagram schematically illustrating the chip Ch3 with the chip Ch2 mounted thereon. As described above, in the driving transistor placement regions ar of the chip Ch3, the driving transistors Q1 are provided, and the drain of each driving transistor Q1 is connected to the anode of a corresponding light-emitting element 2a among the light-emitting elements 2a in the emission section 2 through a lead Lt.

Note that although the chip Ch3 is formed having a multilayer structure in actuality, among the plurality of wiring layers Ly, only the wiring layer Ly1 is illustrated in the diagram to avoid confusion. Likewise, regarding the light-emitting elements 2a, although the emission section 2 actually includes a plurality of light-emitting elements 2a, only three light-emitting elements 2a are illustrated here as an example.

First, in the wiring layer Ly1, a predetermined driving transistor Q1 is connected to a predetermined light-emitting element 2a positioned near the periphery of the chip Ch2 (that is, a light-emitting element 2a a short distance away from the driving transistor Q1) through a lead Lt4.

Additionally, the next driving transistor Q1 provided in the same wiring layer Ly1 is connected, through a lead Lt5, to a predetermined light-emitting element 2a positioned farther inward than the light-emitting element 2a connected by the lead Lt4.

Furthermore, the next driving transistor Q1 provided in the same wiring layer Ly1 is connected, through a lead Lt6, to a predetermined light-emitting element 2a positioned farther inward than the light-emitting element 2a connected by the lead Lt5.

Consequently, when successively connecting the driving transistors Q1 to the light-emitting elements 2a through the leads Lt, the distance from the driving transistors Q1 to the light-emitting elements 2a gradually increases, and therefore the length of the leads Lt connecting the driving transistors Q1 and the light-emitting elements 2a gradually increases. Specifically, when comparing the lead Lt4, the lead Lt5, and the lead Lt6, the lead Lt5 is longer than the lead Lt4, and the lead Lt6 is longer than the lead Lt5 (and the lead Lt4).

In FIG. 17, cross-sectional areas SA7 to SA11 are illustrated for the leads Lt4 to Lt6 at any positions.

For example, in the lead Lt5, the wiring cross-sectional area SA changes from SA8 to SA9 as the wiring length becomes longer.

At this time, by causing the cross-sectional area SA9 to have a greater wiring width in the direction of the plane (planar direction) perpendicular to the vertical direction (thickness direction) of the wiring layers Ly compared to the cross-sectional area SA8, the cross-sectional area SA9 is formed having a larger wiring cross-sectional area than the cross-sectional area SA8.

Similarly, the wiring cross-sectional area SA of the lead Lt6 changes from SA10 to SA11 according to the wiring length, and by successively increasing the wiring width in the planar direction of the wiring layers Ly, the lead Lt6 is formed having a larger wiring cross-sectional area.

In this way, as the wiring length becomes longer, the wiring cross-sectional area SA of the leads Lt becomes larger. For example, the largest cross-sectional area SA11 of the lead Lt6 having a longer wiring length than the lead Lt5 has a larger wiring cross-sectional area than the largest cross-sectional area SA9 of the lead Lt5.

With this arrangement, it is possible to moderate an increase in wiring resistance by increasing the wiring width in the planar direction of the wiring layers Ly.

Note that in the above, the wiring width in the planar direction of the wiring layers Ly and the wiring width in the thickness direction of the wiring layers Ly are described separately, but the wiring cross-sectional area may also be enlarged by increasing both the wiring width in the planar direction of the wiring layers Ly and the wiring width in the thickness direction of the wiring layers Ly. With this arrangement, a moderation of the increase in wiring resistance is also attained.

Next, an example of the leads Lt that electrically connect the light-emitting elements 2a and the driving transistors Q1 will be described using FIG. 18.

Figure 18:
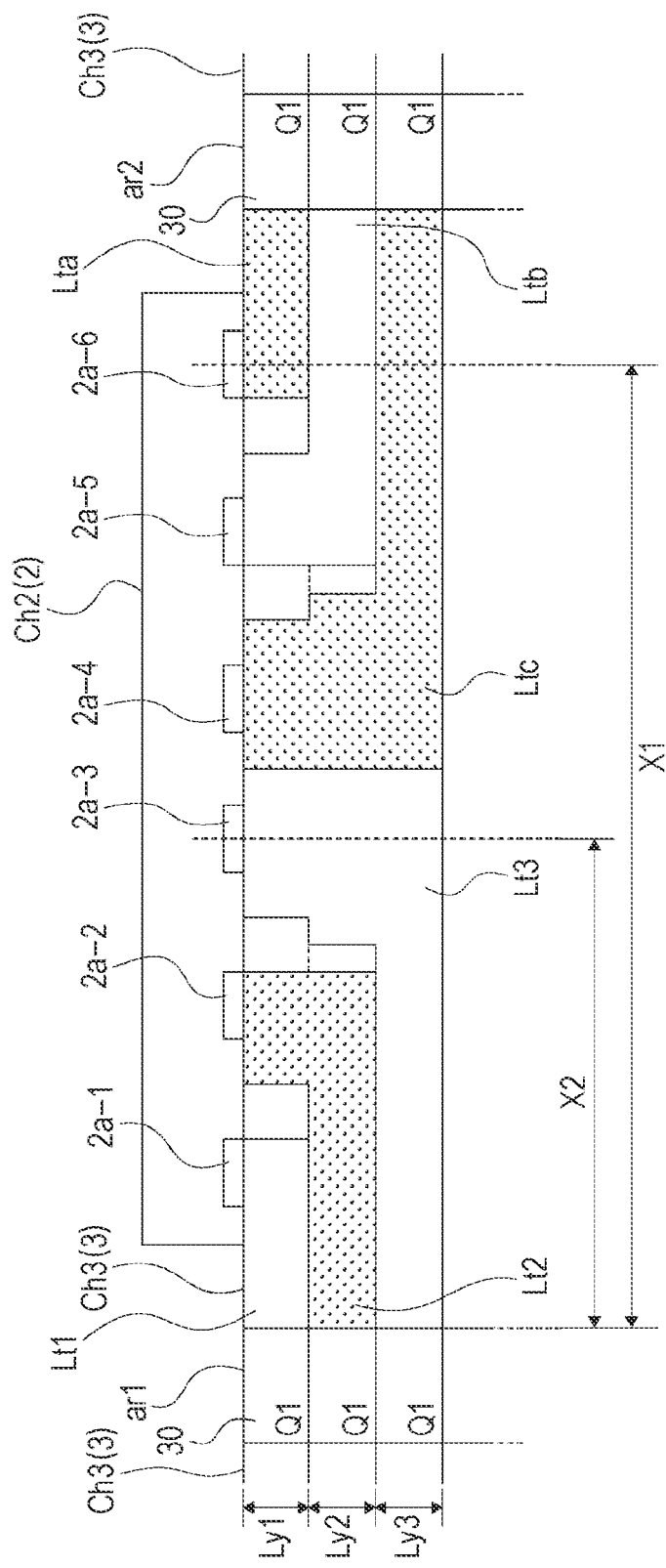
FIG. 18 is another diagram for explaining leads that connect the emission section and the driving section as an embodiment.

First, as illustrated in FIG. 14A, in the case where the driving transistor placement region ar in which the driving transistors Q1 are disposed is provided in a single location with respect to the chip Ch2, the driving transistors Q1 are connected all the way to the light-emitting elements 2a provided on the opposite side of the chip Ch2 away from the driving transistor placement region ar (refer to the distance X1 in FIG. 18). For this reason, the wiring resistance increases due to the longer leads Lt, and as a result of enlarging the wiring cross-sectional area SA of the leads Lt to moderate the increase in the wiring resistance, more space is needed to provide the leads Lt.

Accordingly, as illustrated in FIGS. 13A and 18, it is conceivable to dispose the driving transistor placement regions ar (ar1 and ar2) at positions facing each other in the chip Ch3 with the chip Ch2 in between.

FIG. 18 schematically illustrates a cross section of the chip Ch3 with the chip Ch2 mounted thereon.

Here, for convenience, an example in which the emission section 2 is provided with six light-emitting elements 2a (2a-1 to 2a-6) will be described. Each of the provided light-emitting elements 2a-1 to 2a-6 is not limited to being a single light-emitting element, and each may be formed as a plurality of light-emitting elements 2a, for example.

In this example, the driving transistor Q1 provided in the uppermost wiring layer Ly1 of the driving transistor placement region ar1 is connected, through the lead Lt1, to a predetermined light-emitting element 2a-1 disposed near the periphery of the chip Ch2 on the side near the driving transistor placement region ar1. Additionally, as the wiring layers proceed to the lower layers Ly2, Ly3, and so on, the driving transistor Q1 are respectively connected, through the leads Lt2, Lt3, and so on, to predetermined light-emitting elements 2a-2, 2a-3, and so on farther inward than the light-emitting element 2a connected to the lead Lt in a higher layer.

At this point, if the driving transistor placement regions ar are assumed to be provided only in a single location as the driving transistor placement region ar1, for example, new driving transistors Q1 are provided in wiring layers such as Ly4, Ly5, and Ly6 not illustrated for example, and are connected to the light-emitting elements 2a-4, 2a-5, and 2a-6 by leads Lt4, Lt5, and Lt6 not illustrated. In this case, the length of the lead Lt6 joining the light-emitting element 2a-6 farthest away from the driving transistor placement region an to the corresponding driving transistor Q1 is a distance X1.

However, in this example, the driving transistor placement region ar2 is provided in addition to the driving transistor placement region ar1, and like the driving transistor placement region ar1, the driving transistors Q1 are successively connected to the light-emitting element 2a-6 by the wiring layer Lya, the light-emitting element 2a-5 by the wiring layer Lyb, and the light-emitting element 2a-4 by the wiring layer Lyc.

In this case, because the number of light-emitting elements 2a to connect to the driving transistors Q1 in each driving transistor placement region ar is decreased, the length of the lead Lt3 joining the light-emitting element 2a-3 farthest away from the driving transistor placement region an to the corresponding driving transistor Q1 is a distance X2, which is shorter than the distance X1 in the case where the driving transistor placement regions ar are provided only in a single location. Consequently, the maximum length of the leads Lt to be provided can be shortened.

With this arrangement, it is possible to moderate an increase in the wiring resistance of the leads Lt. Furthermore, it is possible to keep the wiring cross-sectional area SA of the leads Lt from becoming larger than necessary, which is favorable for designing the wiring in the wiring layers Ly.

8. SUMMARY OF EMBODIMENT AND MODIFICATIONS

The light source apparatus (the distance measuring apparatus 1) as an embodiment described above includes an emission section 2 in which a plurality of vertical-cavity surface-emitting laser light-emitting elements 2a is arrayed, and a driving section 3 configured to cause the plurality of light-emitting elements 2a to be emitted of the emission section 2 to emit light, and at least a portion of a region (the driving transistor placement region ar) including driving elements (the driving transistor Q1) in the driving section 3 is disposed so as not to overlap with the emission section 2 (see FIGS. 7A, 7B, 8B, 13A and 13B, and the like).

With this arrangement, the heat generated from the driving transistors Q1 and transmitted to the light-emitting elements 2a is reduced. Also, the heat generated by the light-emitting elements 2a and transmitted to the driving circuit 30 of the driving section 3 is also reduced.

Consequently, it is possible to prevent a heat-induced malfunction that occurs in situations such as when the temperature of the chip Ch2 (emission section 2) in which the light-emitting elements 2a are formed rises easily due to the heat generated by components such as the driving circuit 30 (30A) for causing the light-emitting elements 2a to emit light, leading to a drop in the emission efficiency of the light-emitting elements 2a.

Additionally, it is also possible to prevent a malfunction such as degraded circuit characteristics in the driving circuit 30 (30A) that drives the light-emitting elements 2a because of heat generated by light emission from the light-emitting elements 2a.

Also, in the light source apparatus (distance measuring apparatus 1) as an embodiment, the chip Ch2 in which the emission section 2 is formed is mounted onto the chip Ch3 in which the driving section 3 is formed, and at least a portion of a region (driving transistor placement region ar) including the driving elements (driving transistors Q1) of the driving section 3 is disposed so as not to overlap with the light-emitting elements 2a of the emission section 2 (see FIGS. 13A, 13B, 15A, and 15B, for example).

Furthermore, in the light source apparatus (distance measuring apparatus 1) as an embodiment, the driving section 3 includes a plurality of wiring layers Ly, and leads Lt for electrically connecting the driving elements (driving transistors Q1) to the light-emitting elements 2a are formed in the wiring layers Ly (see FIGS. 16A and 18, for example).

With this arrangement, the leads Lt can be arranged while maintaining the size of the wiring cross-sectional area SA of the leads Lt, and an increase in the wiring resistance of the leads Lt is moderated.

If one attempts to provide all of the leads Lt for connecting the hundreds of light-emitting elements 2a provided in the chip Ch2 (emission section 2) to the driving transistors Q1 in a single wiring layer Ly, it would be necessary to reduce the cross-sectional area SA for each lead Lt, making it difficult to secure enough cross-sectional area SA to moderate an increase in the wiring resistance of each lead Lt.

Consequently, by adopting the above configuration, the cross-sectional area SA of each lead Lt can be secured adequately, thereby making it possible to avoid phenomena such as an increase in power consumption and a rise in temperature associated therewith due to being unable to secure a large enough cross-sectional area SA for the leads Lt.

Furthermore, in the light source apparatus (distance measuring apparatus 1) as an embodiment, the leads Lt are formed such that the distance between the driving elements (driving transistors Q1) and the light-emitting elements 2a connected to each other is longer in lower wiring layers Ly (see FIGS. 16A and 18, for example).

With this arrangement, when drawing out the lead Lt from a lower layer toward a higher layer, it is possible to avoid a situation in which a higher-layer lead Lt obstructs the drawing-out of the lower-layer lead Lt.

Consequently, a shortening of the length of each lead Lt can be attained without complicating the arrangement of the leads Lt. Consequently, an increase in the wiring resistance of the leads Lt is moderated, and phenomena such as an increase in power consumption and a rise in temperature associated therewith can be prevented.

Also, in the light source apparatus (distance measuring apparatus 1) as an embodiment, a plurality of regions (driving transistor placement regions ar) including the driving elements (driving transistors Q1) are provided in the driving section 3 (see FIGS. 13A, 13B, 14A, 14B, 14C, and 18, for example).

By dividing the driving transistor placement regions ar into a plurality of regions in this way, the lengths of the leads Lt connecting the driving transistors Q1 and the light-emitting elements 2a can be shortened. Consequently, an increase in the wiring resistance of the leads Lt is moderated, and phenomena such as an increase in power consumption and a rise in temperature associated therewith can be prevented.

Furthermore, in the light source apparatus (distance measuring apparatus 1) as an embodiment, as the lengths of the leads Lt become longer, portions (such as SA3, SA5, and SA6 in FIGS. 16A, and 16B, and SA9 and SA11 in FIG. 17) of increased cross-sectional area (wiring cross-sectional area SA) when taking a cross section in a plane perpendicular to the extension direction of the leads Lt are formed in the leads Lt.

Because the leads Lt becomes longer as the distance between the driving transistors Q1 and the light-emitting elements 2a increases, the wiring resistance of the leads Lt increases. For this reason, by enlarging the cross-sectional area SA of the leads Lt, an increase in the wiring resistance of the leads Lt is moderated. Consequently, phenomena such as an increase in power consumption and a rise in temperature associated therewith can be prevented.

Also, in the light source apparatus (distance measuring apparatus 1) as an embodiment, in the portions (such as SA3, SA5, and SA6 in FIGS. 16A and 16B) of the leads Lt, the width in the thickness direction of the wiring layers Ly is increased.

With this arrangement, by increasing the width in the thickness direction of the wiring layers Ly, the cross-sectional area SA of the leads increases, and an increase in wiring resistance is moderated. Also, by increasing the width in the thickness direction of the wiring layers Ly to moderate an increase in the wiring resistance, wiring design that leaves surplus room in the planar direction of the wiring layers Ly is possible.

Also, in the light source apparatus (distance measuring apparatus 1) as an embodiment, in the portions (such as SA9, and SA11 in FIG. 17) of the leads Lt, the width in the planar direction of the wiring layers Lt is increased.

With this arrangement, by increasing the width in the planar direction of the wiring layers Ly, the cross-sectional area SA of the leads increases, and an increase in wiring resistance is moderated. Also, by increasing the width in the planar direction of the wiring layers Ly to moderate an increase in the wiring resistance, wiring design that leaves surplus room in other wiring layers Ly is possible.

Furthermore, in the light source apparatus (distance measuring apparatus 1) as an embodiment, the leads Lt provided in the wiring layers Ly increase in cross-sectional area (wiring cross-sectional area SA) in lower wiring layers Ly.

The lower the wiring layer Ly, the greater the distance between the driving transistors Q1 and the light-emitting elements 2a, and the leads Lt become longer as a result. Consequently, the wiring resistance of the leads Lt increases. For this reason, by enlarging the cross-sectional area SA of the leads Lt, an increase in the wiring resistance of the leads Lt is moderated. Consequently, phenomena such as an increase in power consumption and a rise in temperature associated therewith can be prevented.

In addition, in the light source apparatus (the distance measuring apparatus 1) as an embodiment, the driving section 3 is configured to be capable of individually driving emission operation for each predetermined unit of a plurality of the light-emitting elements 2a (see FIG. 3).

With this configuration, the emission driving current is set to turn emission ON/OFF individually for each light-emitting element or in units of blocks acting as multiple light-emitting element groups, for example.

This arrangement achieves a configuration capable of control according to the temperature conditions for each predetermined unit ascertained as the temperature detection value from each temperature sensor 10a.

Additionally, driving control according to an in-plane temperature distribution of the emission section 2 is possible.

With regard to the distance measuring apparatus 1, by controlling the light-emitting elements 2a for each predetermined unit, exposure with uniform emission and light energy is possible, and the brightness of the image of reflected light from the target (subject S) appearing in the image captured by the image sensor 7 can be made to approach uniformity. With this arrangement, the distance measurement sensing accuracy is also improved.

Further, in the light source apparatus (the distance measuring apparatus 1) as an embodiment, an example has been described where the emission section 2 emits light in synchronization with the frame period of the image sensor 7 that receives light emitted by the emission section 2 and reflected by the subject.

With this arrangement, to handle the case of measuring distance by illuminating a subject with light emitted by the emission section and receiving the light with an image sensor, it is possible to cause the light-emitting elements to emit light at appropriate timings according to the frame cycle of the image sensor.

Consequently, an improvement in distance measurement accuracy may be attained. In addition, a suppression of a temperature rise in correspondence with the case where a light source apparatus is used as the light source for measuring the distance to the subject may be attained.

Action and effects similar to the light source apparatus according to the embodiment described above may also be obtained with a sensing module according to such an embodiment.

Note that the above describes an example of a configuration in which the switch SW is provided for each light-emitting element 2a to enable individual control of each light-emitting element 2a, but in the present technology, a configuration enabling the individual driving of each light-emitting element 2a is not essential, but it is sufficient to enable at least individual control for each concurrent emission group.

Additionally, although the above describes an example in which the present technology is applied to a distance measuring apparatus, the present technology is not limited to being applied to a light source for distance measurement.

Note that the effects described in this specification are merely non-limiting examples, and there may be other effects.

9. PRESENT TECHNOLOGY

Note that the present technology may be configured as below.

(1)
A light source apparatus including:
an emission section in which a plurality of vertical-cavity surface-emitting laser light-emitting elements is arrayed; and
a driving section configured to cause the plurality of light-emitting elements of the emission section to emit light, in which
at least a portion of a region including driving elements in the driving section is disposed so as not to overlap with the emission section.

(2)
The light source apparatus according to (1), in which
a chip in which the emission section is formed is mounted onto a chip in which the driving section is formed, and at least a portion of the region including the driving elements of the driving section is disposed so as not to overlap with the light-emitting elements of the emission section.

(3)
The light source apparatus according to (1) or (2), in which
the driving section includes a plurality of wiring layers in which leads for electrically connecting the driving elements and the light-emitting elements are formed.

(4)
The light source apparatus according to (3), in which
the leads are formed such that a distance between the driving elements and the light-emitting elements connected to each other is longer in lower wiring layers.

(5)
The light source apparatus according to (4), in which
a plurality of regions including the driving elements is provided in the driving section.

(6)
The light source apparatus according to any one of (3) to (5), in which
as a length of the leads increases, a portion of increased cross-sectional area when taking a cross section in a plane perpendicular to an extension direction of the leads is formed in the leads.

(7)
The light source apparatus according to (6), in which
in the portion of the leads, a width is increased in a thickness direction of the wiring layers.

(8)
The light source apparatus according to (6) or (7), in which
in the portion of the leads, a width is increased in a planar direction of the wiring layers.

(9)
The light source apparatus according to any one of (6) to (8), in which
the cross-sectional area of the leads provided in the wiring layers is larger in lower wiring layers.

(10)
The light source apparatus according to any one of (1) to (9), in which
the driving section is configured to be capable of individually driving emission operation for each predetermined unit of a plurality of the light-emitting elements.

(11)
The light source apparatus according to any one of (1) to (10), in which
the emission section is configured to emit light in synchronization with a frame period of an image sensor configured to receive light emitted by the emission section and reflected by a subject.

(12)
A sensing module including:
a light source apparatus provided with an emission section in which a plurality of vertical-cavity surface-emitting laser light-emitting elements is arrayed, and a driving section configured to cause the plurality of light-emitting elements to be emitted of the emission section to emit light, in which at least a portion of a region including switching elements in the driving section is disposed so as not to overlap with the emission section; and
an image sensor configured to capture an image by receiving light emitted by the emission section and reflected by a subject.

REFERENCE SIGNS LIST

1 Distance measuring apparatus
2 Emission section
2a Light-emitting element
3, 3A Driving section
7 Image sensor
10 Temperature detection section
S Subject
B Substrate
Ch2, Ch3, Ch4, Ch34, Ch7 Chip
30, 30A Driving circuit
31 Driving control section
Q1, Q2 Driving transistor
SW Switch
100, 100A Light source apparatus

The invention claimed is:
1. A light source apparatus, comprising:
an emission section in which a plurality of vertical-cavity surface-emitting laser (VCSEL) light-emitting elements is arrayed; and
a driving section configured to control the plurality of VCSEL light-emitting elements of the emission section to emit light, wherein the driving section includes a plurality of wiring layers,
the plurality of wiring layers includes leads for electrically connecting driving elements of the driving section and the light-emitting elements,
a portion of cross-sectional area of the leads increases based on an increase in a length of the leads,
the portion of the cross-sectional area corresponds to a cross section in a plane perpendicular to an extension direction of the leads, and
at least a portion of a region including the driving elements in the driving section is disposed so as not to overlap with the emission section.

2. The light source apparatus according to claim 1, wherein
a first chip that includes the emission section is on a second chip that includes the driving section, and
at least a portion of the region including the driving elements of the driving section is disposed so as not to overlap with the light-emitting elements of the emission section.

3. The light source apparatus according to claim 1, wherein
the driving elements are connected to the light-emitting elements via the leads, and
a distance between the driving elements and the light-emitting elements is longer in lower wiring layers.

4. The light source apparatus according to claim 3, wherein
a plurality of regions including the driving elements is in the driving section.

5. The light source apparatus according to claim 1, wherein
in the portion of the cross-sectional area of the leads, a width is increased in a thickness direction of the wiring layers.

6. The light source apparatus according to claim 1, wherein
in the portion of the cross-sectional area of the leads, a width is increased in a planar direction of the wiring layers.

7. The light source apparatus according to claim 1, wherein
the cross-sectional area of the leads provided in the wiring layers is larger in lower wiring layers.

8. The light source apparatus according to claim 1, wherein
the driving section is further configured to individually drive emission operation for each unit of a plurality of the light-emitting elements.

9. The light source apparatus according to claim 1, wherein
the emission section is further configured to emit light in synchronization with a frame period of an image sensor; and
the image sensor is configured to receive light emitted by the emission section and reflected by a subject.

10. A sensing module, comprising:
a light source apparatus that comprises:
an emission section in which a plurality of vertical-cavity surface-emitting laser (VCSEL) light-emitting elements is arrayed, and
a driving section configured to control the plurality of VCSEL light-emitting elements of the emission section to emit light, wherein
the driving section includes a plurality of wiring layers,
the plurality of wiring layers includes leads for electrically connecting driving elements of the driving section and the light-emitting elements,
a portion of cross-sectional area of the leads increases based on an increase in a length of the leads,
the portion of the cross-sectional area corresponds to a cross section in a plane perpendicular to an extension direction of the leads, and
at least a portion of a region including driving elements in the driving section is disposed so as not to overlap with the emission section; and
an image sensor configured to capture an image based on reception of a light emitted by the emission section and reflected by a subject.

* * * * *